(12) United States Patent
Tomiyama

(10) Patent No.: US 9,103,527 B2
(45) Date of Patent: Aug. 11, 2015

(54) LIGHT SOURCE UNIT AND PROJECTION DISPLAY DEVICE WITH THE SAME

(75) Inventor: Mizuho Tomiyama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 267 days.

(21) Appl. No.: 13/823,838

(22) PCT Filed: Nov. 15, 2011

(86) PCT No.: PCT/JP2011/076233
§ 371 (c)(1),
(2), (4) Date: Apr. 18, 2013

(87) PCT Pub. No.: WO2012/067080
PCT Pub. Date: May 24, 2012

(65) Prior Publication Data
US 2013/0222770 A1    Aug. 29, 2013

(30) Foreign Application Priority Data

Nov. 18, 2010  (JP) .................. 2010-257997

(51) Int. Cl.
G03B 21/14    (2006.01)
F21V 9/14     (2006.01)
G02B 5/30     (2006.01)
H01L 33/58    (2010.01)
G02F 1/1335   (2006.01)

(52) U.S. Cl.
CPC ............... *F21V 9/14* (2013.01); *G02B 5/3025* (2013.01); *G03B 21/14* (2013.01); *H01L 33/58* (2013.01); *G02F 2001/133538* (2013.01)

(58) Field of Classification Search
USPC ............. 353/20; 362/19; 359/486.01, 486.02, 359/486.03; 349/5, 7, 96
See application file for complete search history.

(56) References Cited

U.S. PATENT DOCUMENTS

| | | | | |
|---|---|---|---|---|
| 4,902,112 | A * | 2/1990 | Lowe ........................ | 359/486.02 |
| 7,061,561 | B2 * | 6/2006 | Silverstein et al. ........... | 349/117 |
| 2002/0101659 | A1 * | 8/2002 | Hansen et al. ................ | 359/486 |
| 2011/0205457 | A1 * | 8/2011 | Sawaki ............................. | 349/5 |
| 2011/0205458 | A1 * | 8/2011 | Sawaki ............................. | 349/5 |

(Continued)

FOREIGN PATENT DOCUMENTS

| | | |
|---|---|---|
| CN | 1306626 A | 8/2001 |
| CN | 101320161 A | 12/2008 |

(Continued)

OTHER PUBLICATIONS

The international search report for PCT/JP2011/076233 mailed on Feb. 21, 2012.

(Continued)

*Primary Examiner* — William C Dowling
(74) *Attorney, Agent, or Firm* — Sughrue Mion, PLLC

(57) ABSTRACT

A light source unit includes LED 1 with an emission surface and polarizer 2 that is positioned opposite the emission surface of LED 1 and in which the direction of a transmission axis varies depending on a position in the plane of polarizer 2. Polarizer 2 includes a recessed and protruding structure which transmits, from among light that travels from LED 1 side into polarizer 2, a portion of the light whose polarization direction is parallel to the transmission axis, while reflecting and diffracting a portion of the light whose polarization direction is orthogonal to the transmission axis. The recessed and protruding structure includes diffraction grating 3.

12 Claims, 24 Drawing Sheets

(56) References Cited

U.S. PATENT DOCUMENTS

| | | | |
|---|---|---|---|
| 2012/0199855 A1* | 8/2012 | Katayama | 257/88 |
| 2012/0200788 A1* | 8/2012 | Aboshi | 349/5 |
| 2013/0021773 A1* | 1/2013 | Katayama | 362/19 |

FOREIGN PATENT DOCUMENTS

| | | |
|---|---|---|
| CN | 102576792 A | 7/2012 |
| JP | 2002514778 A | 5/2002 |
| JP | 200579104 A | 3/2005 |
| JP | 2006133275 A | 5/2006 |
| JP | 200860534 A | 3/2008 |
| JP | 2008304673 A | 12/2008 |

OTHER PUBLICATIONS

Chinese Office Action for CN Application No. 201180055565.4 issued on Dec. 12, 2013 with English Translation.

* cited by examiner

LIGHT SOURCE UNIT AND PROJECTION DISPLAY DEVICE WITH THE SAME

This application is a National Stage Entry of PCT/JP2011/076233 filed Nov. 15, 2011, which claims priority from Japanese Patent Application 2010-257997 filed Nov. 18, 2010, the contents of all of which are incorporated herein by reference, in their entirety.

TECHNICAL FIELD

The present invention relates to a light source unit with a surface-emitting light emitting element represented by a light emitting diode (LED), and in particular, to a light source unit capable of outputting polarized light.

BACKGROUND ART

Some recent liquid crystal projectors use an LED as a light source for illuminating a liquid crystal panel.

In general, in a liquid crystal projector, a liquid crystal panel needs to be irradiated with polarized light. Output light from the LED is non-polarized light. Thus, if the LED is used as a light source for illuminating the liquid crystal panel, all light rays from the LED need to be polarized in one direction.

FIG. 1 shows a light source unit capable of polarizing all the light rays from the LED in one direction.

As shown in FIG. 1, the light source unit includes LED 100 and polarizer 101 positioned opposite the emission surface of LED 100.

Polarizer 101 may include periodic recessed and protruding patterns which are one-dimensional in a plane or may be formed from a polymer. Polarizer 101 used herein includes recessed and protruding patterns.

Polarizer 101 includes a transmission axis, and transmits light with a polarization component parallel to the transmission axis, while reflecting light with a polarization component orthogonal to the transmission axis. In polarizer 101 with recessed and protruding patterns, the transmission axis generally coincides with the direction of periodicity of the recessed and protruding patterns. In this case, for light incident on polarizer 101, the polarization component parallel to the direction of periodicity of the recessed and protruding patterns is referred to as TM waves (or TM polarized light). The polarization component parallel to a longitudinal direction of the recessed and protruding patterns (which is orthogonal to the direction of periodicity) is referred to as TE waves (or TE polarized light). That is, the TM wave included in light that exits from the emission surface of LED 100 passes through polarizer 101, while the TE wave also included therein is reflected toward LED 100 by polarizer 101.

The emission surface of LED 100 specularly reflects the TE wave from polarizer 101. The reflected light travels toward polarizer 101. With regard to the specular reflection of the TE wave by the emission surface, the incident light and the reflected light have the same direction of polarization. That is, the direction of polarization present before the specular reflection is maintained even after the specular reflection.

According to the above-described light source unit, only the TM wave included in the light exiting through the emission surface of LED 100 passes through polarizer 101. This allows all the light rays output from the light source unit to be polarized in one direction.

However, as shown in FIG. 2, the TE wave, included in the light exiting through the emission surface of LED 100, propagates between the emission surface of LED 100 and polarizer 101 while being repeatedly reflected. The TE wave cannot be used as output light from the light source unit.

When means for polarization-converting the TE wave into the TM wave, for example, a quarter wave plate, is provided between the LED and the polarizer, the intensity of outgoing light from the light source unit can be increased. FIG. 3 shows a light source unit with a quarter wave plate.

As shown in FIG. 3, quarter wave plate 102 is provided between LED 100 and polarizer 101. Quarter wave plate 102 is arranged in proximity to the emission surface of LED 100, which is a heat source. Quarter wave plate 102 thus needs to be formed from a material having high heat resistance. At present, the quarter wave plate 102 is formed from a crystal such as quartz or mica, which offers high heat resistance. Such a quarter wave plate has a thickness set to several hundred μm with processing accuracy or the like taken into account.

As shown in FIG. 4, the TE wave reflected by polarizer 101 is converted into circularly polarized light by quarter wave plate 102. The circularly polarized light then enters the emission surface of LED 100.

The circularly polarized light having entered the emission surface of LED 100 is specularly reflected. The specularly reflected light enters quarter wave plate 102 with the circular polarization maintained. The circularly polarized light from the emission surface of LED 100 is converted into a TM wave by quarter wave plate 102. The TM wave from quarter wave plate 102 passes through polarizer 101.

As described above, the TE wave reflected by polarizer 101 is converted into a TM wave by passing through quarter wave plate 102 twice, that is, when traveling from polarizer 101 toward LED 100 and when traveling from the emission surface of LED 100, by which the TE wave is specularly reflected, toward polarizer 101. Polarization-converting the TE wave into the TM wave in this manner enables an increase in the intensity of outgoing light from the light source unit.

Patent Literature 1 discloses a technique relating to a light source unit including an LED and a polarizer. Patent Literature 2 discloses a technique relating to a light source unit with a quarter wave plate provided between an LED and a polarizer.

CITATION LIST

Patent Literature

Patent Literature 1: JP2008-60534A
Patent Literature 2: JP2005-79104A

SUMMARY OF THE INVENTION

However, the light source unit shown in FIG. 3 poses the following problems.

In a light source unit in which polarizer 101 is provided opposite the emission surface of LED 100, a portion of light propagating between the emission surface of LED 100 and polarizer 101 leaks to the outside through a side surface of the light source unit. The light leaking through the side surface has a large exit angle and cannot be coupled to an optical system of the projector. Thus, the light cannot be efficiently used. Moreover, the leaking light is precluded from passing through polarizer 101 and thus has a direction of polarization different from the direction of polarization of the other light rays. Thus, even irradiation of a liquid crystal panel with this light results in the utilization of only about half of the total amount of light.

FIG. 5 shows the relation between the amount of output light (the amount of outgoing light) and the distance between the emission surface of the LED and the polarizer in the light source unit including the LED and the polarizer (see FIG. 1). The axis of ordinate indicates the amount of outgoing light. The axis of abscissas indicates the distance (mm) between the emission surface of the LED and the polarizer. The scale on the axis of ordinate is normalized so that the amount of outgoing light is 1 when the distance between the emission surface of the LED and the polarizer is 0 mm.

In the example shown in FIG. 5, the emission surface of the LED is 3 mm×4 mm in size, and the polarizer is 3 mm×4 mm in size. The emission surface of the LED has a reflectance of 100%, and a reflection condition is that light is specularly reflected. The polarizer has a transmittance of 100% and a reflectance of 0% with respect to the TM wave. The polarizer has a transmittance of 0% and a reflectance of 100% with respect to the TE wave. The calculation has been performed under these conditions.

As shown in FIG. 5, when the amount of outgoing light is 100% if distance d between the emission surface of the LED and the polarizer is 0, then if distance d is 0.5 mm, the amount of outgoing light decreases by about 45%. If distance d is 1.0 mm, the amount of outgoing light decreases by about 60%. This is because light leaks through the gap between the LED and the polarizer (the gap corresponds to the side surface of the light source unit). Increased size of the gap between the emission surface of the LED and the polarizer increases the amount of light leaking through the side surface of the light source unit, while reducing the amount of light emitted by the light source unit.

In the light source unit shown in FIG. 3, quarter wave plate 102 is formed from a crystal such as quartz or mica and is several hundred μm in thickness. When quarter wave plate 102, which is several hundred μm in thickness, is provided between LED 100 and polarizer 101, the size of the gap between the emission surface of LED 100 and polarizer 101 increases. As a result, the amount of light emitted by the light source unit decreases.

Some quarter wave plates are formed from a film having a thickness of about several hundred nm. However, such a film offers only low heat resistance, and thus the use of such a light source unit as shown in FIG. 3 results in difficulty in providing an accurate phase difference owing to the adverse effect of heat.

An object of the present invention is to provide a light source unit which enables a reduction in the size of the gap between the emission surface and the polarizer and which also allows the intensity of outgoing light to be increased, as well as a projection display device with the same.

To achieve the above object, a light source unit according to the present invention includes:

a light emitting element with an emission surface; and a polarizer that is provided opposite the emission surface of the light emitting element and in which a direction of a transmission axis varies depending on a position in a plane of the polarizer, wherein the polarizer includes a recessed and protruding structure which transmits, of light that exits from the emission surface and that travels from the light emitting element side into the polarizer, a portion of the light whose polarization direction is parallel to the transmission axis, while reflecting and diffracting a portion of the light whose polarization direction is orthogonal to the transmission axis.

A projection display device according to the present invention includes:

the above-described light source unit;

a display element that spatially modulates light from the light source unit; and a projection optical system that projects image light formed by the display element.

REFERENCE SIGNS LIST

1 LED
2 Polarizer
3 Diffraction grating

DESCRIPTION OF EMBODIMENTS

Now, an exemplary embodiment will be described with reference to the drawings.

(First Exemplary Embodiment)

Figure 6:
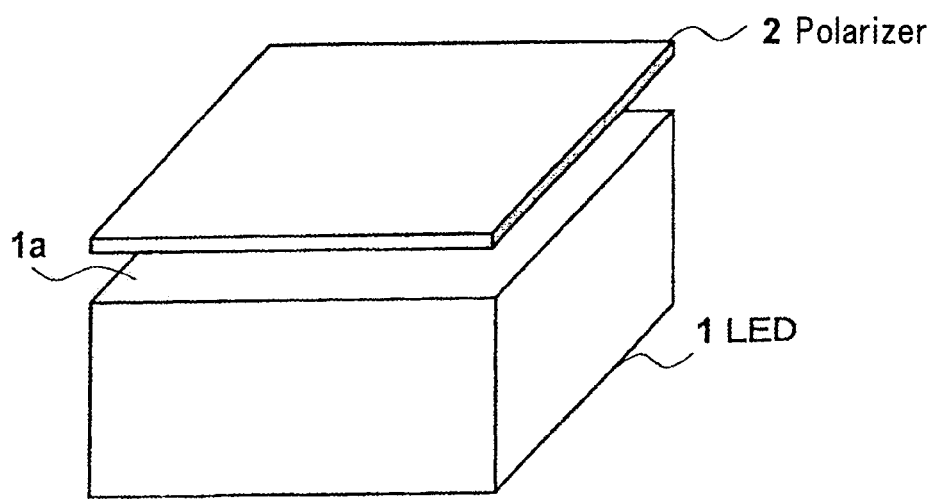
FIG. 6 is a perspective view showing a configuration of a light source unit according to a first exemplary embodiment.
Figure 7:
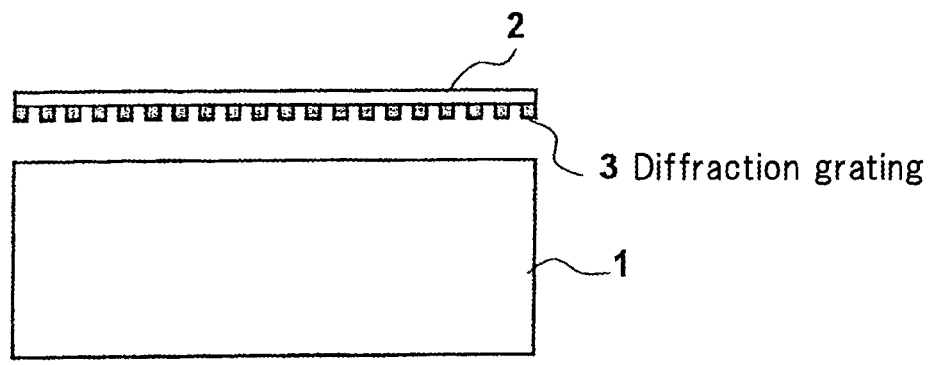
FIG. 7 is a cross-sectional view of the light source unit shown in FIG. 6.

FIG. 6 is a perspective view showing a configuration of a light source unit according a first exemplary embodiment. FIG. 7 is a cross-sectional view of the light source unit shown in FIG. 6.

As shown in FIG. 6 and FIG. 7, the light source unit includes LED 1 with emission surface 1a and polarizer 2 provided opposite emission surface 1a.

LED 1 includes a stacking section in which, for example, an n-type layer and a p-type layer are deposited such that they sandwich an active layer. An n-type layer-side surface or a p-type layer-side surface of the stacking section corresponds to emission surface 1a. Light generated by the active layer is emitted through emission surface 1a. LED 1 may be a surface-emitting solid light source such as a semiconductor laser.

Light traveling from polarizer 2 side into LED 1 is specularly reflected by emission surface 1a of LED 1 or inside LED 1. The polarization state of the light present before the specular reflection is maintained even after the specular reflection.

A surface of polarizer 2 which faces emission surface 1a includes a recessed and protruding structure with diffraction grating 3. The recessed and protruding structure serves to vary the direction of a transmission axis depending on a position in the plane of the polarizer. The recessed and protruding structure transmits a portion of incident light which has a direction of polarization parallel to each transmission axis (TM polarized light), while reflecting and diffracting a portion of the incident light which has a direction of polarization orthogonal to the transmission axis (TE polarized light). Here, the direction of the transmission axis is equal to a direction parallel to the direction of polarization of the transmitted light.

In general, polarizer 2 has a transmittance and a reflectance which can be controlled by a combination of a material, the periodicity of recesses and protrusions, and a film thickness. Furthermore, varying the direction of periodicity of the recessed and protruding structure allows the transmission axis to be formed in the desired direction. Additionally, the direction of the transmission axis can be varied depending on the position in the plane of identical polarizer 2.

When light with a direction of polarization orthogonal to the transmission axis is reflected by polarizer 2, diffraction grating 3 acts to diffract the reflected light.

Figure 8:
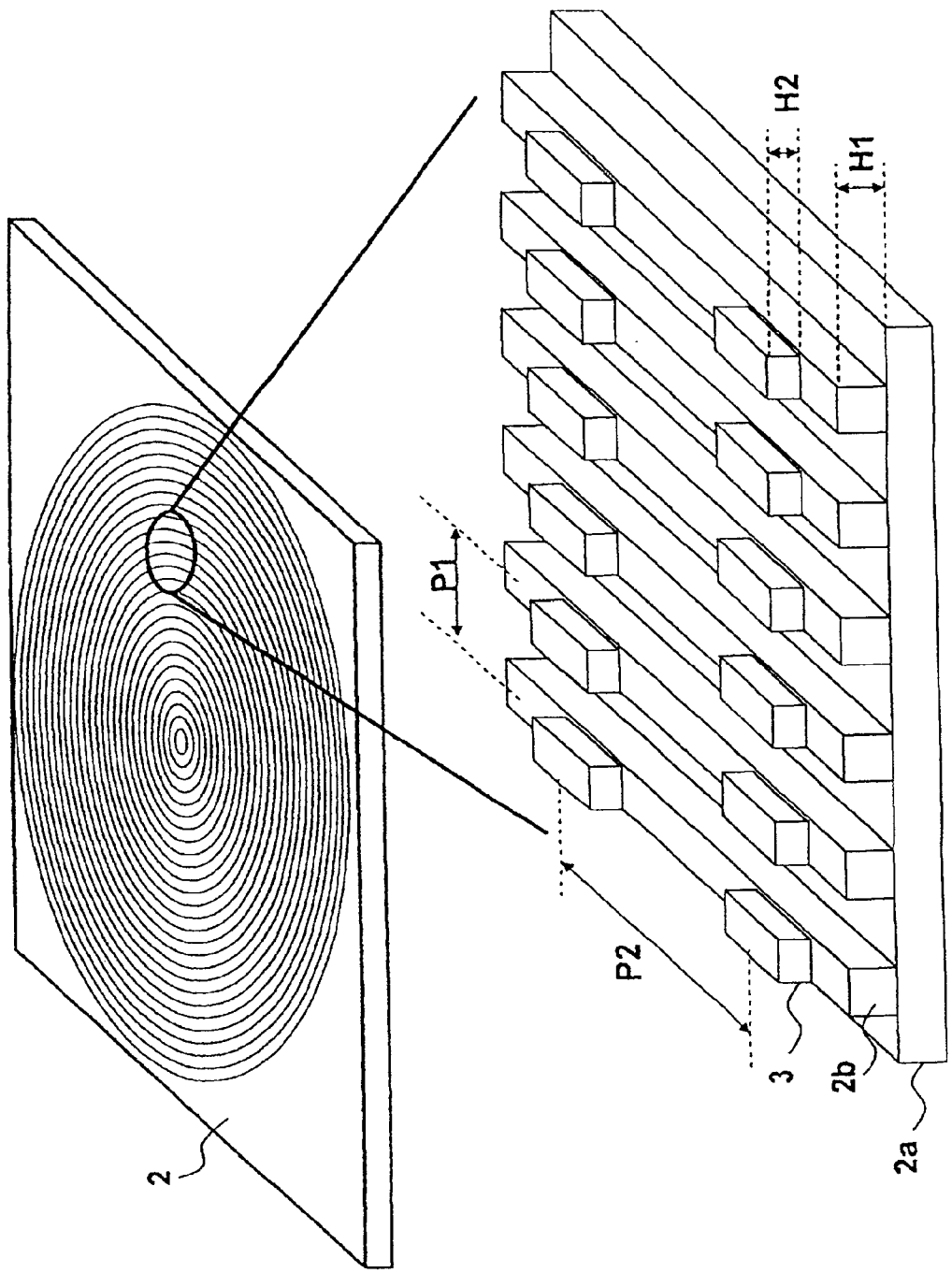
FIG. 8 is a schematic diagram showing a specific configuration of a polarizer and a diffraction grating in the light source unit shown in FIG. 6.
Figure 9:
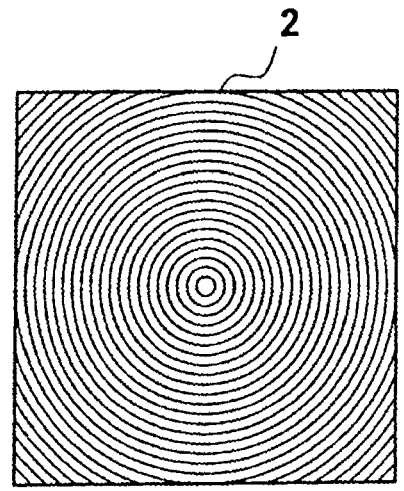
FIG. 9 is a schematic diagram showing recessed and protruding patterns of the polarizer in the light source unit shown in FIG. 6.
Figure 10:
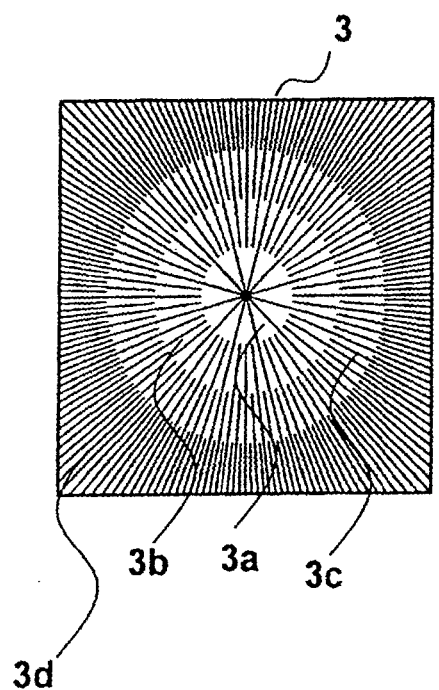
FIG. 10 is a schematic diagram showing recessed and protruding patterns of the diffraction grating in the light source unit shown in FIG. 6.

FIG. 8 is a schematic diagram showing a specific configuration of polarizer 2 and diffraction grating 3. FIG. 9 is a schematic diagram showing recessed and protruding patterns of polarizer 2. FIG. 10 is a schematic diagram showing recessed and protruding patterns of diffraction grating 3.

As shown in FIG. 8 and FIG. 9, polarizer 2 includes a plurality of concentric recessed and protruding patterns 2b periodically formed on substrate 2a such as quartz in a radial direction of substrate 2a. Polarizer 2 includes transmission axes perpendicular to recessed and protruding patterns 2b (in a TM direction). That is, polarizer 2 includes radial transmission axes.

Recessed and protruding patterns 2b of polarizer 2 and diffraction grating 3 are formed from a metal, that is, one metal selected from among aluminum, silver, and gold, or a compound containing one of these metals. As shown in FIG. 8 and FIG. 10, the recessed and protruding patterns of diffraction grating 3 are formed radially on recessed and protruding patterns 2b of polarizer 2. Each of the recessed and protruding patterns of diffraction grating 3 is orthogonal to a tangent to each recessed and protruding patterns 2b of polarizer 2.

In the example shown in FIG. 10, diffraction grating 3 includes four concentric annular areas 3a to 3d. A plurality of radial recessed and protruding patterns are formed in each of annular areas 3a to 3d. The number of recessed and protruding patterns is set so as to make the circumferential intervals between the recessed and protruding patterns almost the same among the annular areas.

Recessed and protruding patterns 2b of polarizer 2 have pitch P1 of, for example, 140 nm. Recessed and protruding patterns 2b of polarizer 2 have depth H1 of, for example, 100 nm.

The recessed and protruding patterns of diffraction grating 3 have pitch P2 given by $\lambda < P2 < 2\lambda$ ($\lambda$ denotes the emission wavelength of LED 1). For example, if $\lambda$ is 530 nm, pitch P2 is 600 nm. The recessed and protruding patterns of diffraction grating 3 have depth H2 of, for example, 600 nm.

Now, the operation of the light source unit according to the exemplary embodiment will be specifically described.

First, the operation of polarizer 2 alone (the light source unit without diffraction grating 3) will be described.

Figure 11:
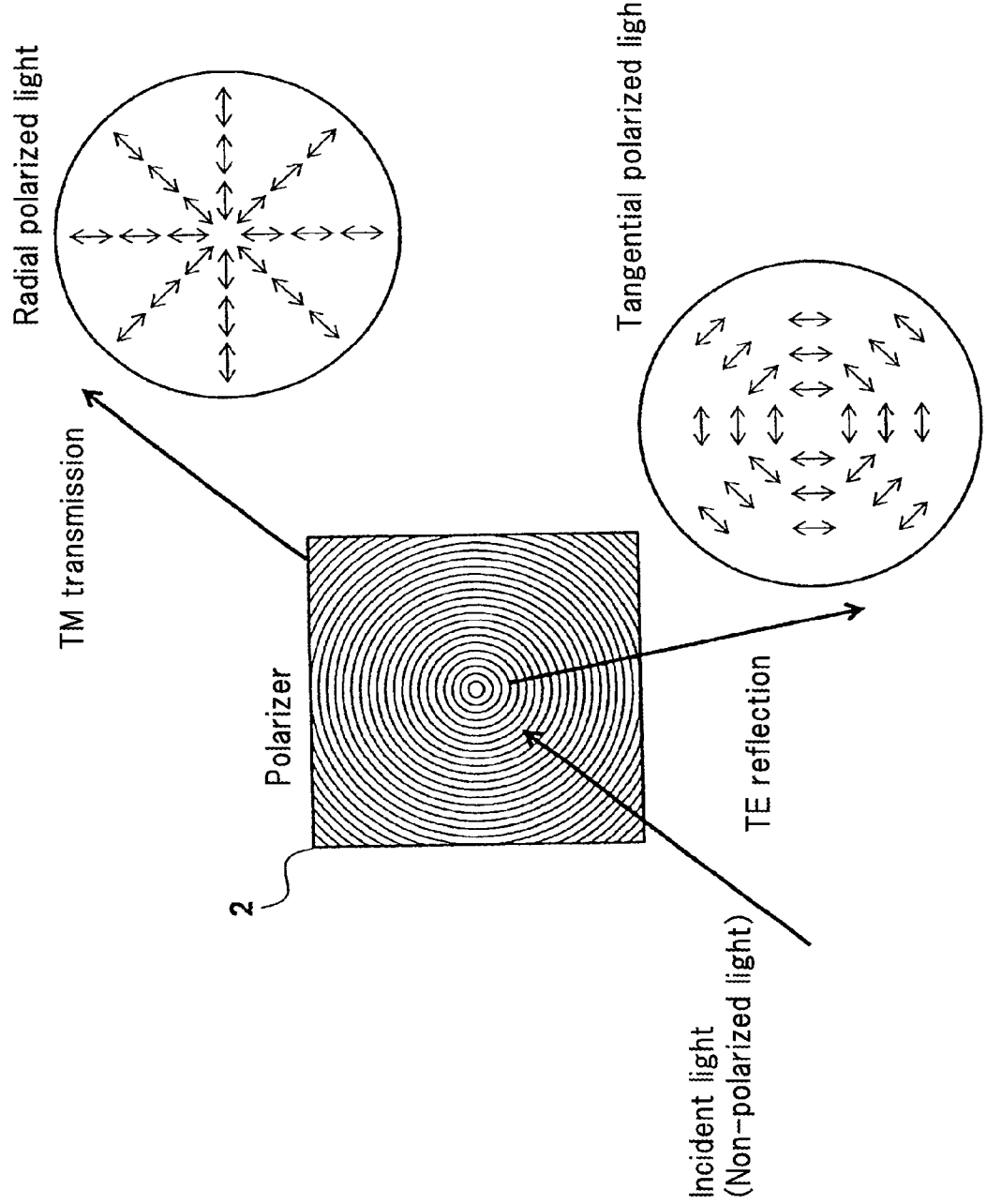
FIG. 11 is a schematic diagram illustrating the operation of the polarizer with the concentric recessed and protruding patterns shown in FIG. 9.

FIG. 11 is a schematic diagram illustrating the operation of polarizer 2 with concentric recessed and protruding patterns 2b shown in FIG. 9.

As shown in FIG. 11, polarizer 2 transmits a portion of incident light (non-polarized light) which is TM polarized light and has a direction of polarization parallel to each transmission axis, while reflecting a portion of the incident light which is TE polarized light and has a direction of polarization orthogonal to the transmission axis.

The transmission axes of polarizer 2 are radially formed. Thus, the TM polarized light transmitted through entire polarizer 2 is radial polarized light with a direction of polarization parallel to each transmission axis. On the other hand, the TE polarized light reflected by entire polarizer 2 is tangential polarized light with a direction of polarization orthogonal to each transmission axis.

The operation of polarizer 2 with diffraction grating 3 will be described.

Figure 12:
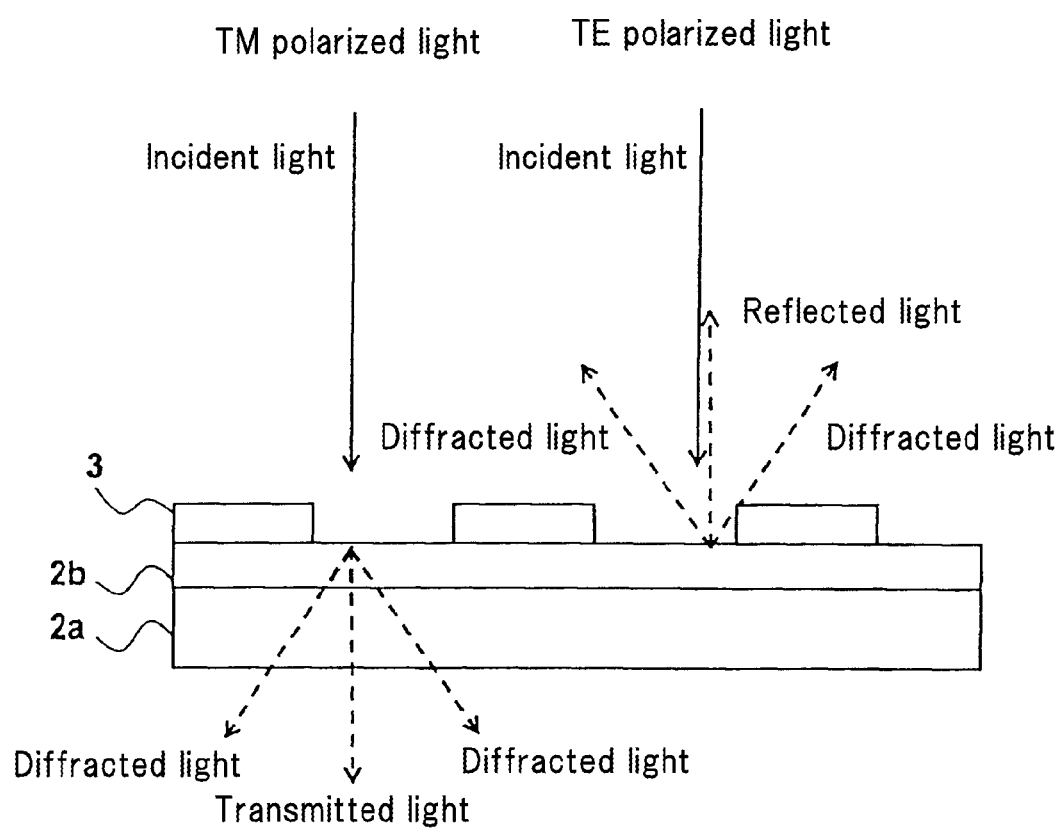
FIG. 12 is a schematic diagram illustrating the operation of the polarizer with the concentric recessed and protruding patterns shown in FIG. 9 and on which the diffraction grating including the radial recessed and protruding patterns shown in FIG. 10 is formed.

FIG. 12 is a schematic diagram illustrating the operation of polarizer 2 with concentric recessed and protruding patterns 2b shown in FIG. 9 and on which diffraction grating 3 including the radial recessed and protruding patterns shown in FIG. 10 is formed.

As shown in FIG. 12, the surface of polarizer 2 on which diffraction grating 3 is formed corresponds to an incident surface. TM polarized light included in the incident light passes through polarizer 2 and diffraction grating 3. TE polarized light included in the incident light is reflected and diffracted by the incident surface.

The TE polarized light reflected and diffracted by the incident surface (tangential polarized light) is diffused light including reflected light and diffracted light. The TM polarized light having passed through polarizer 2 and diffraction grating 3 (radial polarized light) is diffused light including transmitted light and diffracted light. However, the TM polarized light may be prevented from being diffracted light (transmitted light) depending on conditions.

Figure 13:
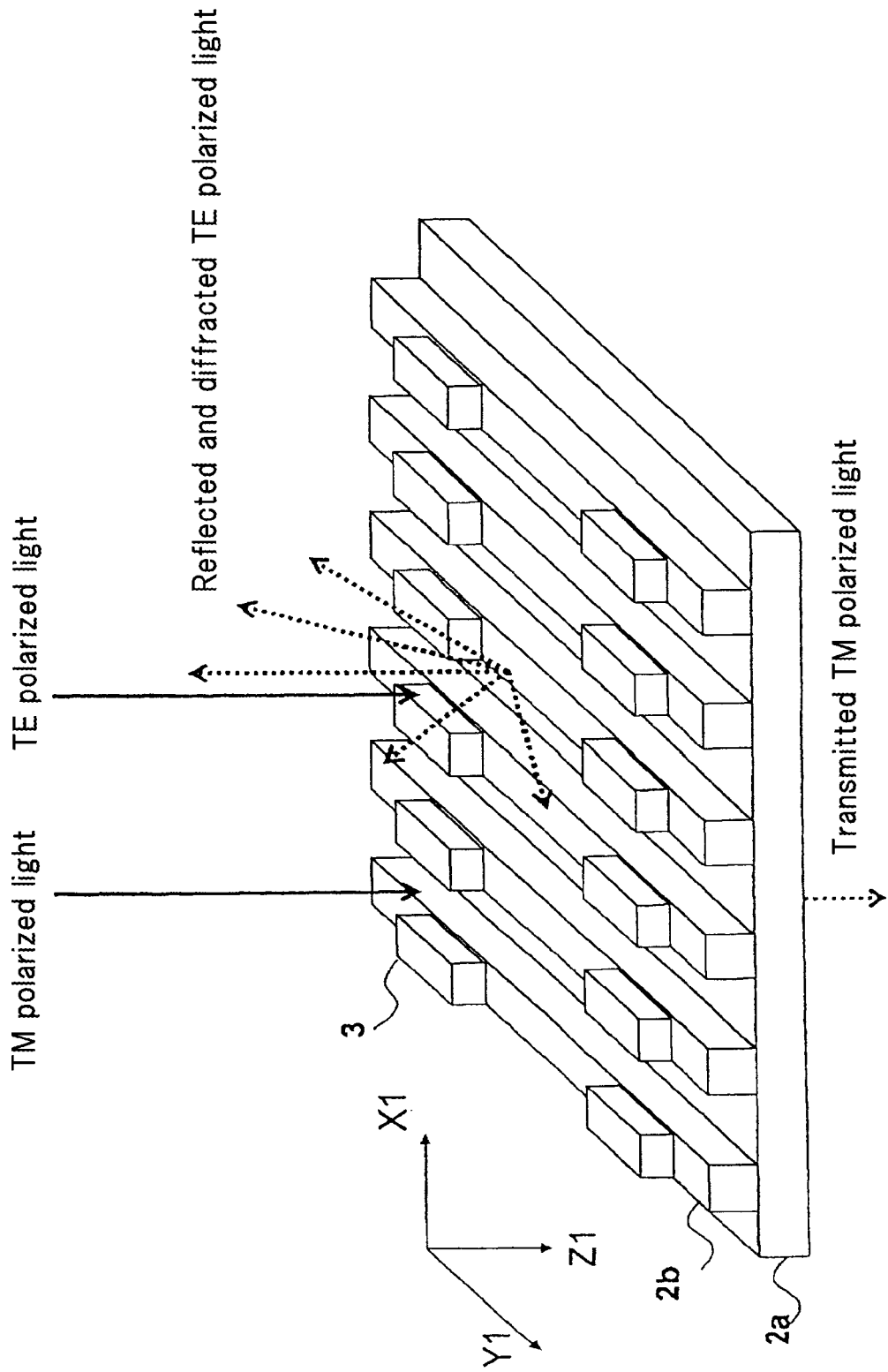
FIG. 13 is a schematic diagram showing reflected and diffracted TE polarized light in a part of the polarizer in the light source unit shown in FIG. 6.
Figure 14:
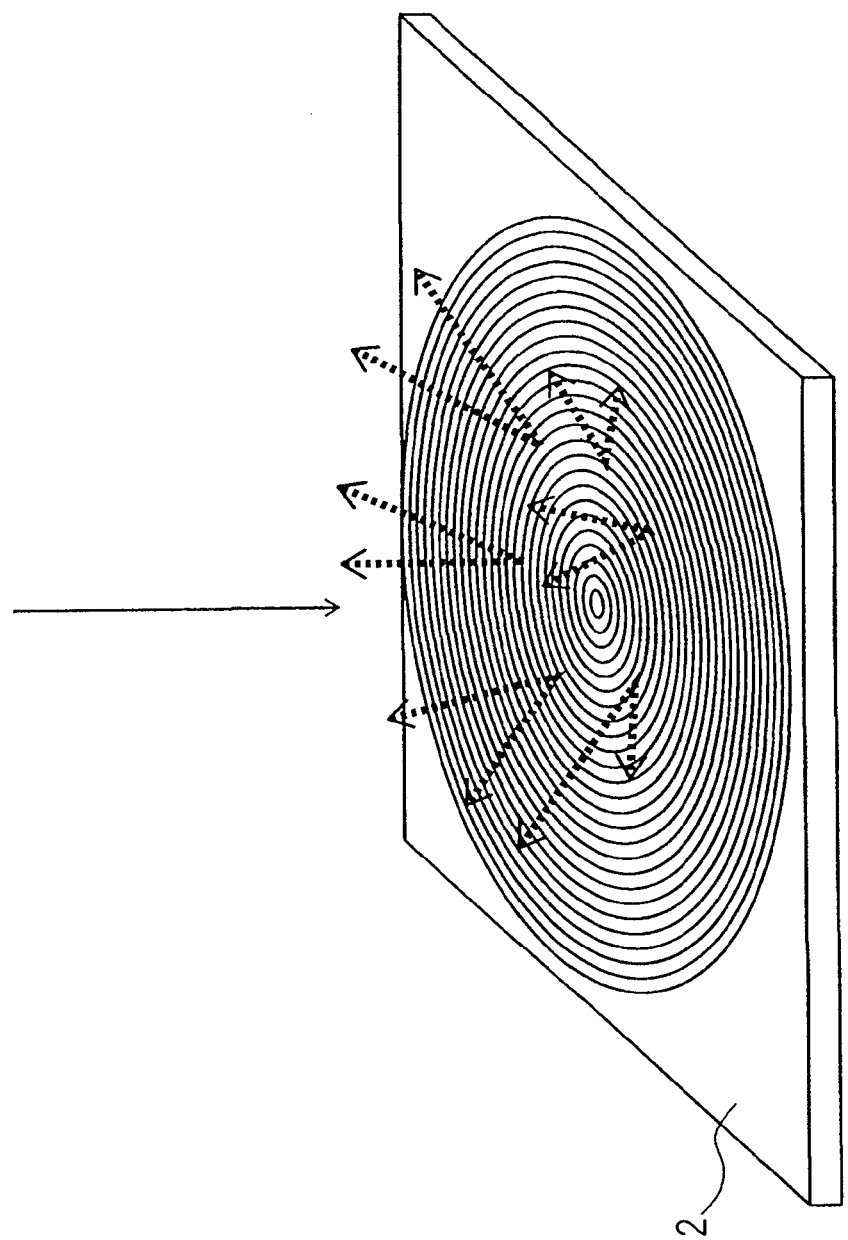
FIG. 14 is a schematic diagram showing diffracted TE polarized light in the entire polarizer in the light source unit shown in FIG. 6.

FIG. 13 schematically shows reflected TM polarized light and diffracted TM polarized light in a portion of polarizer 2 with diffraction grating 3. FIG. 14 schematically shows diffracted TE polarized light in entire polarizer 2 with diffraction grating 3. In FIG. 14, the recessed and protruding patterns of diffraction grating 3 are omitted for convenience.

As shown in FIG. 13, the TE polarized light entering polarizer 2 is reflected and diffracted, and the diffracted light is diffracted in the direction of periodicity of the recessed and protruding patterns of diffraction grating 3. As shown in FIG. 14, in polarizer 2 as a whole, the reflected TE polarized light is diffracted in a circumferential direction by diffraction grating 3. That is, diffraction grating 3 acts to diffuse the TE polarized light (tangential polarized light) reflected by polarizer 2.

The light source unit according to the exemplary embodiment can increase the intensity of outgoing light by the effects of polarizer 2 and diffraction grating 3 described with reference to FIG. 11 to FIG. 14. The operation of the light source unit as a whole will be described.

Light exiting through emission surface 1a of LED 1 (non-polarized light) enters the incident surface of polarizer 2 on which diffraction grating 3 is formed.

The incident surface of polarizer 2 transmits the TM polarized light, included in the incident light, while reflecting and diffracting the TE polarized light, included in the incident light. The TE polarized light reflected and diffracted by the incident surface of polarizer 2 (tangential polarized light) is diffused light and is incident on LED 1.

Light resulting from diffusion of the TE polarized light (tangential polarized light) from polarizer 2 is specularly reflected toward polarizer 2 by emission surface 1a of LED 1 or inside LED 1. The diffused light specularly reflected by LED 1 enters the incident surface of polarizer 2 again.

As described above, the TE polarized light is reflected and diffracted by the incident surface of polarizer 2, the reflected and diffracted TE polarized light is diffused, and the diffused light is specularly reflected by emission surface 1a of LED 1 to enter again the incident surface of polarizer 2. During this process, a portion of the diffused light specularly reflected by emission surface 1a of LED 1 (mostly the diffracted light) enters an area of the incident surface of polarizer 2 which is different from the area where the TE polarized light was reflected and diffracted.

For example, the light resulting from the diffusion of the TE polarized light reflected and diffracted by area A1 of the incident surface of polarizer 2 in which the transmission axis is formed in a first direction (the reflected ad diffracted TE polarized light has a direction of polarization orthogonal to the first direction) is partly specularly reflected by emission surface 1a of LED 1 to enter area A2 of the incident surface of polarizer 2 which is different from area A1. If area A2 is an area in which the transmission axis is formed in a second direction orthogonal to the first direction, the direction of polarization of the TE polarized light from area A1 is parallel to the transmission axis of area A2. Thus, a portion of the TE polarized light from area A1 which enters area A2 passes through polarizer 2 as TM polarized light.

The light source unit according to the exemplary embodiment has a first feature and a second feature described below.

The first feature is that polarizer 2 is configured so that the transmission axis varies depending on the position on the plane of polarizer 2. Thus, the TE polarized light reflected by polarizer 2 becomes tangential polarized light.

The second feature is that diffraction grating 3 is provided on a surface of polarizer 2 which faces LED 1. This allows the TE polarized light reflected by polarizer 2 (tangential polarized light) to be diffused.

According to the first and second features, while the TE polarized light propagates between the incident surface of polarizer 2 and emission surface 1a of LED 1 while being repeatedly reflected and diffracted, a portion of the TE polarized light (diffused light) passes through polarizer 2 as TM polarized light. The polarization conversion from the TE polarized light into the TM polarized light allows the intensity of outgoing light to be increased.

Furthermore, in the light source unit according to the exemplary embodiment, diffraction grating 3 is formed from a metal, that is, one metal selected from among aluminum, silver, and gold, or a compound containing one of these metals. Diffraction grating 3 formed from such a metal offers high heat resistance. Hence, diffraction grating 3 provided in the vicinity of LED 1 is prevented from having its performance degraded.

Figure 1:
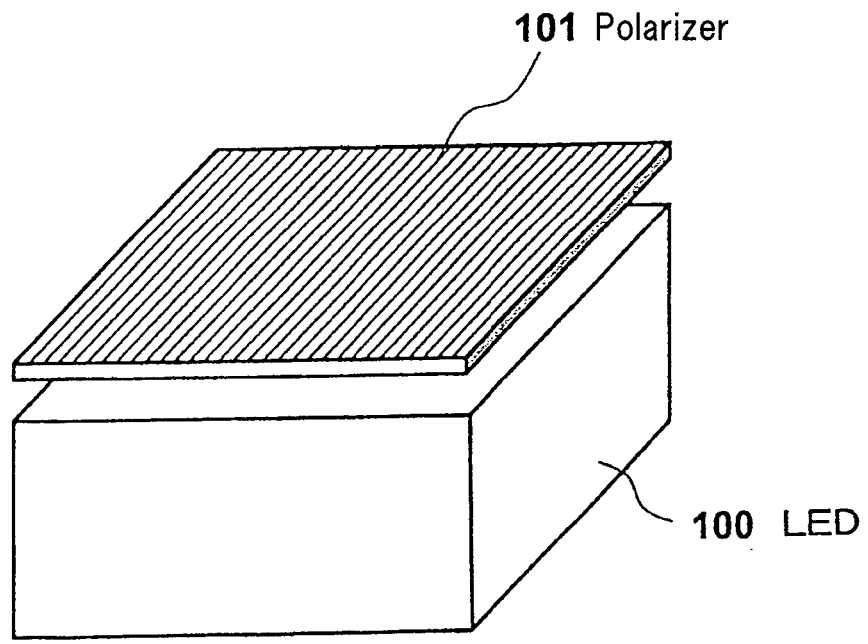
FIG. 1 is a perspective view showing a general configuration of a light source unit capable of polarizing all light rays from an LED in one direction.
Figure 2:
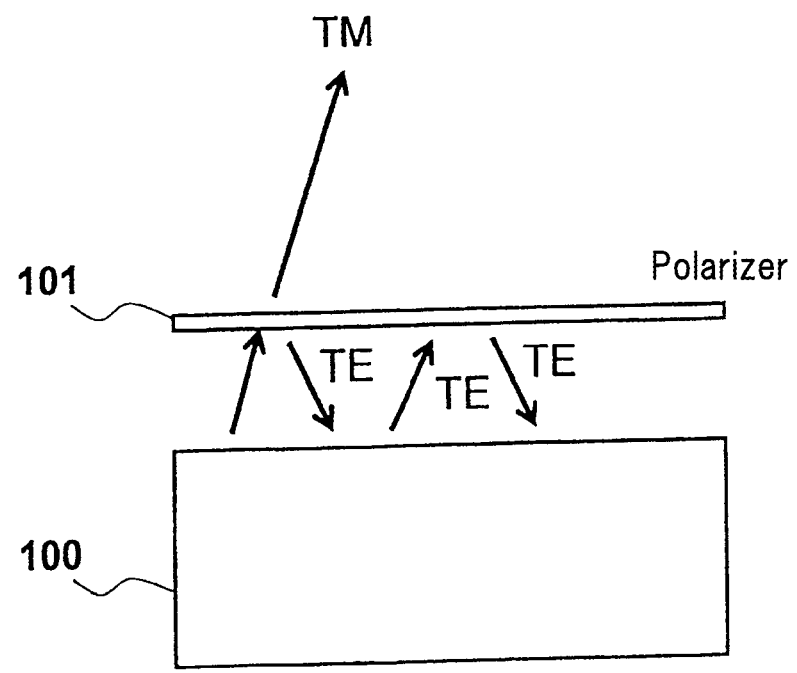
FIG. 2 is a schematic diagram illustrating the operation of the light source unit shown in FIG. 1.
Figure 3:
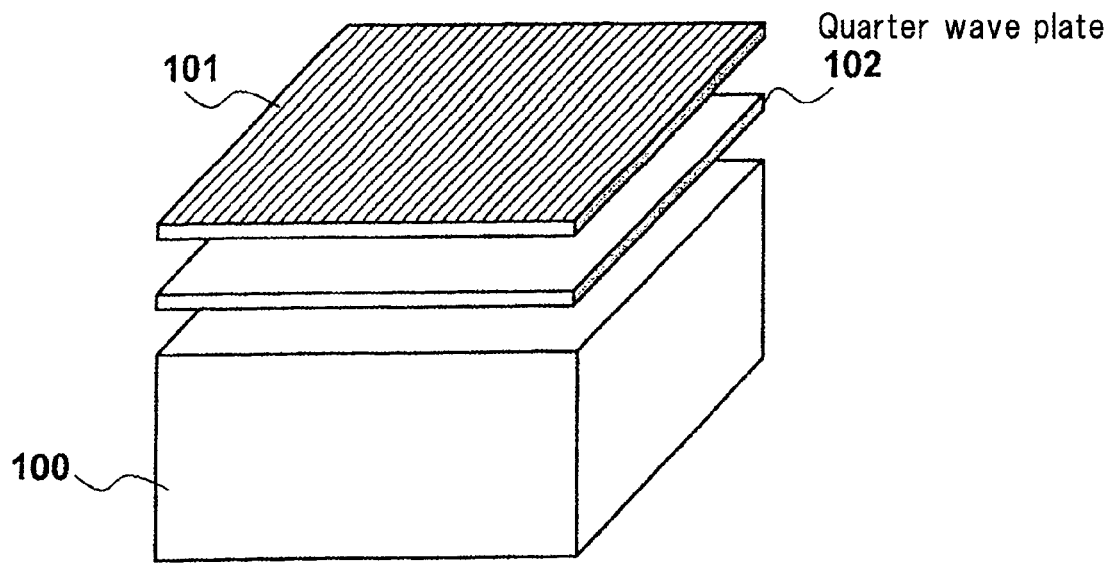
FIG. 3 is a perspective view showing a configuration of another light source unit capable of polarizing all light rays from an LED in one direction.
Figure 4:
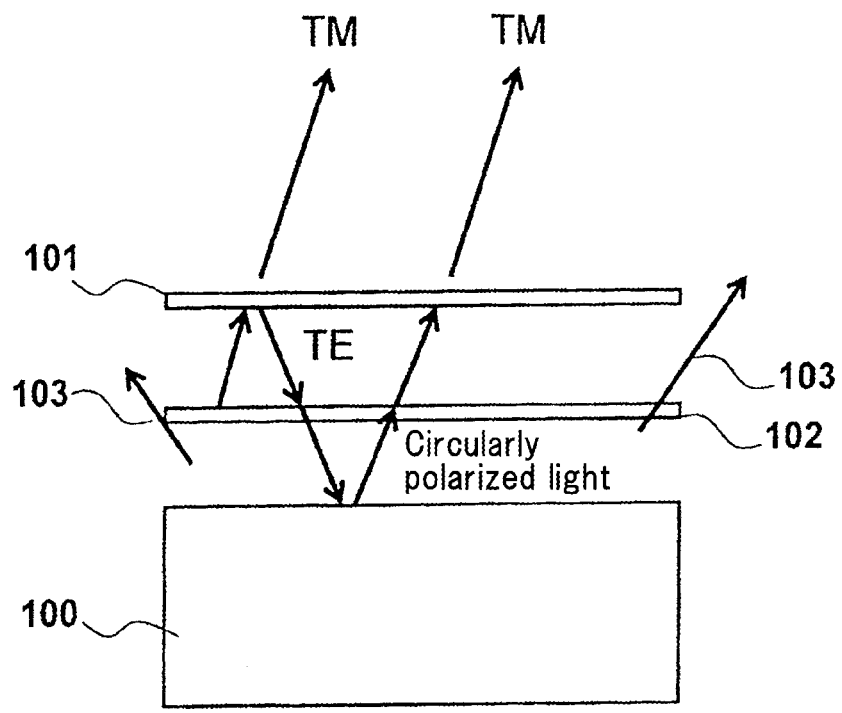
FIG. 4 is a schematic diagram illustrating the operation of the light source unit shown in FIG. 3.
Figure 5:
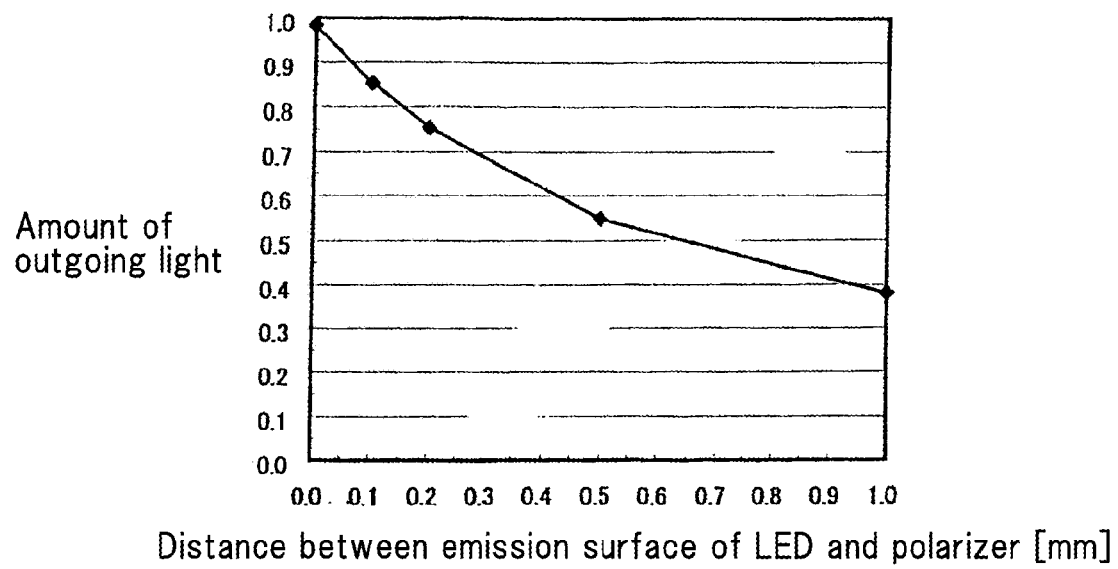
FIG. 5 is a characteristic diagram showing the relation between the amount of outgoing light and the distance between an emission surface of the LED and a polarizer in the light source unit shown in FIG. 1.

In addition, diffraction grating 3 is normally about several hundred nm in thickness, though the thickness may depend on the emission wavelength of LED 1, and is sufficiently thinner than quarter wave plate 102 formed from a crystal such as quartz or mica as in the case of the light source unit shown in FIG. 3. Thus, the light source unit according to the exemplary embodiment is subjected to leakage of a sufficiently small amount of light through the side surface compared to the light source unit shown in FIG. 3.

Now, a method for producing polarizer 2 and diffraction grating 3 in the light source unit according to the exemplary embodiment will be described.

FIG. 15A to FIG. 15H show a procedure of a process of producing polarizer 2 with diffraction grating 3.

Figure 15A:
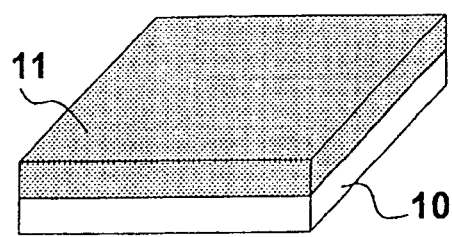
FIG. 15A is a process diagram illustrating a procedure of a technique for producing the polarizer and the diffraction grating in the light source unit shown in FIG. 6.
Figure 15B:
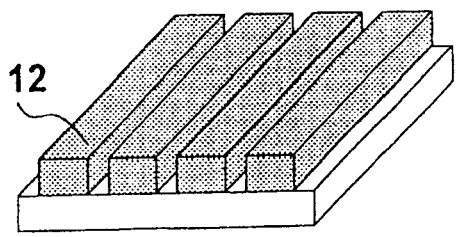
FIG. 15B is a process diagram illustrating the procedure of the technique for producing the polarizer and the diffraction grating in the light source unit shown in FIG. 6.

First, as shown in FIG. 15A, a resist is applied to substrate 10 formed of quartz or the like to form resist layer 11. Then, as shown in FIG. 15B, resist pattern 12 is formed utilizing photolithography.

Figure 15C:
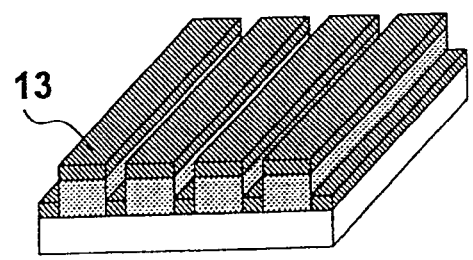
FIG. 15C is a process diagram illustrating the procedure of the technique for producing the polarizer and the diffraction grating in the light source unit shown in FIG. 6.
Figure 15D:
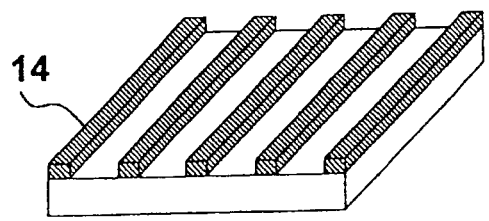
FIG. 15D is a process diagram illustrating the procedure of the technique for producing the polarizer and the diffraction grating in the light source unit shown in FIG. 6.

Then, as shown in FIG. 15C, aluminum layer 13 is formed on substrate 10 with resist pattern 12 formed thereon, utilizing metal deposition. Then, as shown in FIG. 15D, resist pattern 12 and the aluminum layer on resist pattern 12 are lifted off to form recessed and protruding patterns 14 serving as polarizer 2, on substrate 10.

Figure 15E:
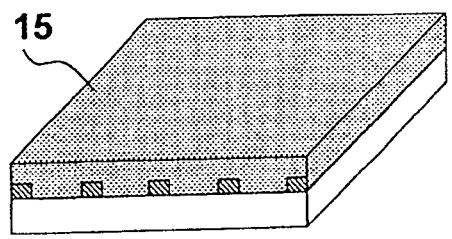
FIG. 15E is a process diagram illustrating the procedure of the technique for producing the polarizer and the diffraction grating in the light source unit shown in FIG. 6.
Figure 15F:
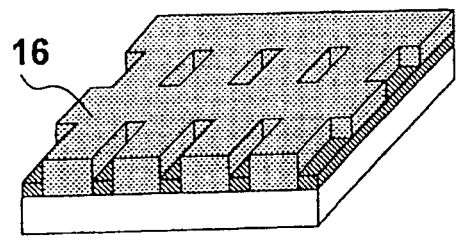
FIG. 15F is a process diagram illustrating the procedure of the technique for producing the polarizer and the diffraction grating in the light source unit shown in FIG. 6.

Then, as shown in FIG. 15E, a resist is applied to substrate 10 with recessed and protruding patterns 14 formed thereon to form resist layer 15. Then, as shown in FIG. 15F, resist pattern 16 is formed utilizing photolithography.

Figure 15G:
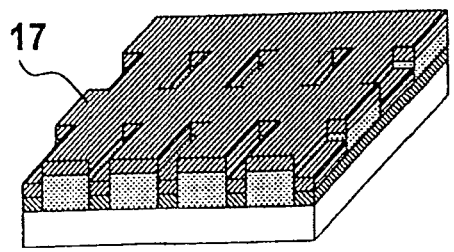
FIG. 15G is a process diagram illustrating the procedure of the technique for producing the polarizer and the diffraction grating in the light source unit shown in FIG. 6.

Then, as shown in FIG. 15G, aluminum layer 18 is formed on substrate 10 with resist pattern 16 formed thereon, utilizing metal deposition.

Figure 15H:
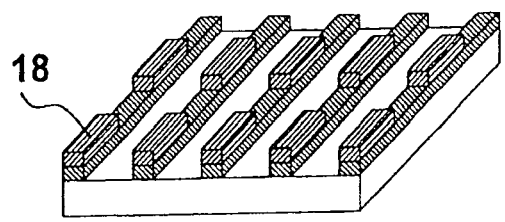
FIG. 15H is a process diagram illustrating the procedure of the technique for producing the polarizer and the diffraction grating in the light source unit shown in FIG. 6.

Finally, as shown in FIG. 15H, resist pattern 16 and the aluminum layer on resist pattern 16 are lifted off to form recessed and protruding patterns 18 serving as diffraction grating 3, on recessed and protruding patterns 14.

FIG. 16A to FIG. 16H show a procedure of another process of producing polarizer 2 with diffraction grating 3.

Figure 16A:
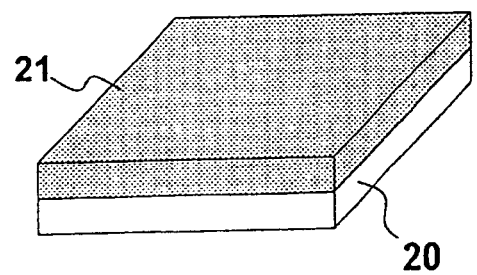
FIG. 16A is a process diagram illustrating an alternative procedure to the technique for producing the polarizer and the diffraction grating in the light source unit shown in FIG. 6.
Figure 16B:
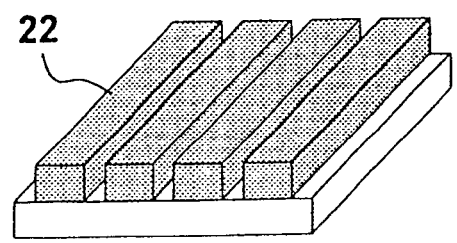
FIG. 16B is a process diagram illustrating the alternative procedure to the technique for producing the polarizer and the diffraction grating in the light source unit shown in FIG. 6.

First, as shown in FIG. 16A, a resist is applied to substrate 20 formed of quartz or the like to form resist layer 21. Then, as shown in FIG. 16B, resist pattern 22 is formed utilizing photolithography.

Figure 16C:
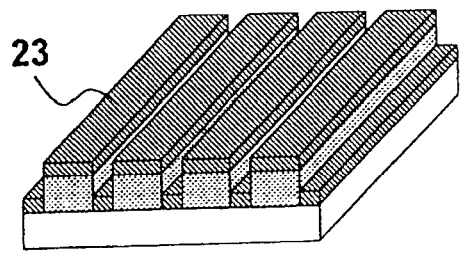
FIG. 16C is a process diagram illustrating the alternative procedure to the technique for producing the polarizer and the diffraction grating in the light source unit shown in FIG. 6.
Figure 16D:
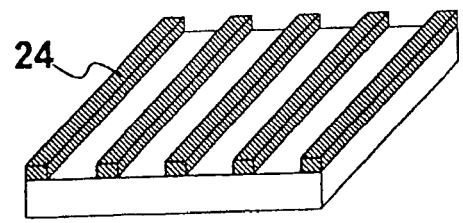
FIG. 16D is a process diagram illustrating the alternative procedure to the technique for producing the polarizer and the diffraction grating in the light source unit shown in FIG. 6.

Then, as shown in FIG. 16C, aluminum layer 23 is formed on substrate 20 with resist pattern 22 formed thereon, utilizing metal deposition. Then, as shown in FIG. 16D, resist pattern 22 and the aluminum layer on resist pattern 22 are lifted off to form recessed and protruding patterns 24 serving as polarizer 2, on substrate 20.

Figure 16E:
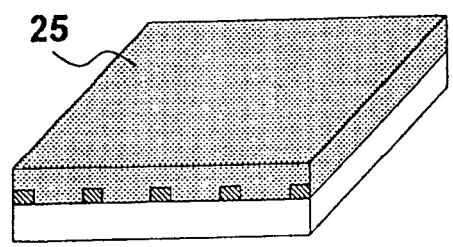
FIG. 16E is a process diagram illustrating the alternative procedure to the technique for producing the polarizer and the diffraction grating in the light source unit shown in FIG. 6.
Figure 16F:
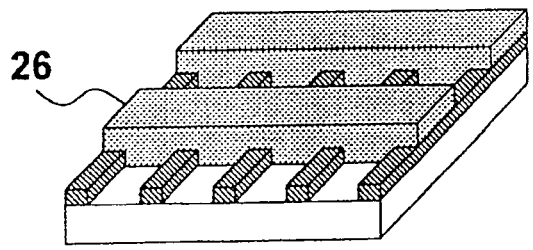
FIG. 16F is a process diagram illustrating the alternative procedure to the technique for producing the polarizer and the diffraction grating in the light source unit shown in FIG. 6.

Then, as shown in FIG. 16E, a resist is applied to substrate 20 with recessed and protruding patterns 24 formed thereon to form resist layer 25. Then, as shown in FIG. 16F, resist pattern 26 is formed utilizing photolithography.

Figure 16G:
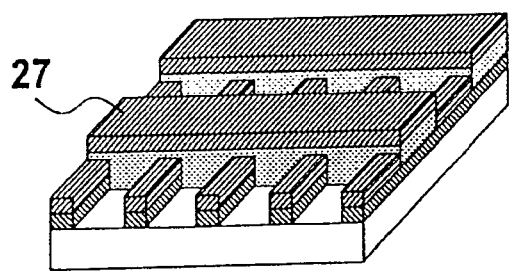
FIG. 16G is a process diagram illustrating the alternative procedure to the technique for producing the polarizer and the diffraction grating in the light source unit shown in FIG. 6.

Then, as shown in FIG. 16G, aluminum layer 28 is formed on substrate 20 with resist pattern 26 formed thereon, utilizing metal deposition. Here, the metal deposition is carried out obliquely with respect to the surface of substrate 20 with resist pattern 26 formed thereon. Thus, the entire area of the surface of substrate 20 except the area in which recessed and protruding patterns 24 are formed is shielded by recessed and protruding patterns 24 and is not subjected to deposition of aluminum.

Figure 16H:
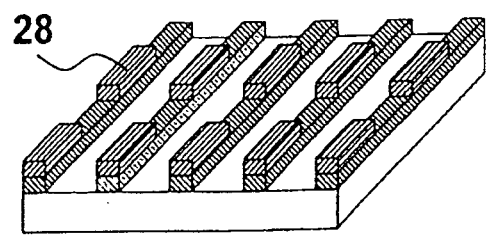
FIG. 16H is a process diagram illustrating the alternative procedure to the technique for producing the polarizer and the diffraction grating in the light source unit shown in FIG. 6.

Finally, as shown in FIG. 16H, resist pattern 26 and the aluminum layer on resist pattern 26 are lifted off to form recessed and protruding patterns 28 serving as diffraction grating 3, on recessed and protruding patterns 24.

In the light source unit according to the exemplary embodiment, diffraction grating 3 may include recessed and protruding patterns different from the radial recessed and protruding patterns. Diffraction grating 3 may include any pattern provided that the pattern allows the TE polarized light or TM polarized light reflected by polarizer 2 to be diffracted.

Furthermore, polarizer 2 may include any recessed and protruding patterns provided that the direction of the transmission axis varies depending on the position in the plane of polarizer 2 and provided that the recessed and protruding patterns enable the TE polarized light and the TM polarized light to be separated from each other.

For example, polarizer 2 may be formed from radial recessed and protruding patterns, and diffraction grating 3 may be formed from concentric recessed and protruding patterns. In this case, the TM polarized light transmitted through polarizer 2 becomes tangential polarized light. The TE polarized light reflected and diffracted by polarizer 2 becomes radial polarized light.

(Second Exemplary Embodiment)

Figure 17:
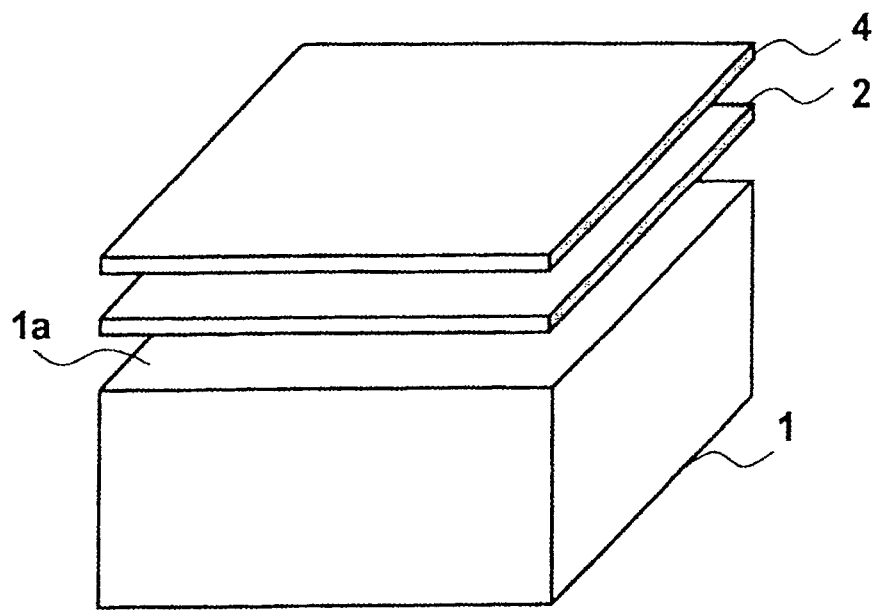
FIG. 17 is a perspective view showing a configuration of a light source unit according to a second exemplary embodiment.
Figure 18:
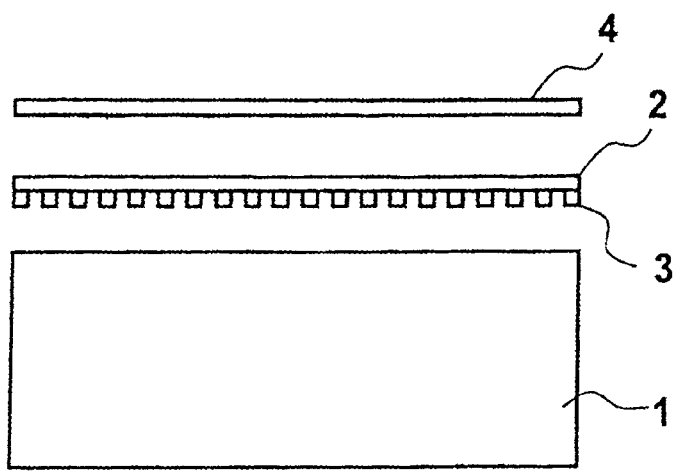
FIG. 18 is a cross-sectional view of the light source unit shown in FIG. 17.

FIG. 17 is a perspective view showing a configuration of a light source unit according to a second exemplary embodiment. FIG. 18 is a cross-sectional view of the light source unit shown in FIG. 17.

The light source unit shown in FIG. 17 and FIG. 18 includes wave plate 4 positioned opposite a surface of polarizer 2 which is opposite to an LED 1-side surface of polarizer 2. The second exemplary embodiment is different from the first exemplary embodiment in this regard. LED 1, polarizer 2, and diffraction grating 3 in the second exemplary embodiment are the same as LED 1, polarizer 2, and diffraction grating 3 in the first exemplary embodiment.

Wave plate 4 polarizes all light rays transmitted through polarizer 2 in a certain direction, and includes, for example, a half λ plate.

The direction of the optical axis of wave plate 4 varies depending on the position in the plane of wave plate 4. The different optical axes correspond to the respective transmission axes of polarizer 2.

Figure 19A:
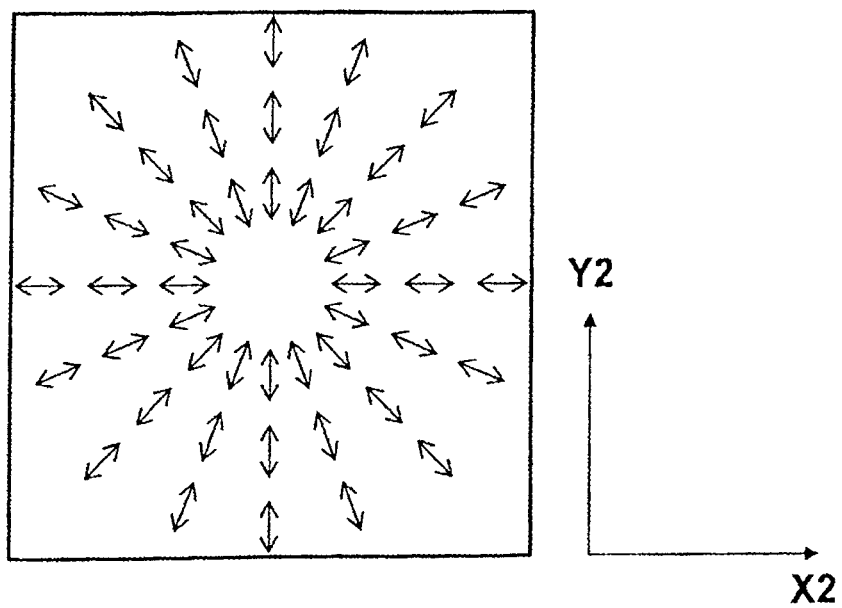
FIG. 19A is a schematic diagram showing the directions of transmission axes of a polarizer in the light source unit shown in FIG. 17.
Figure 19B:
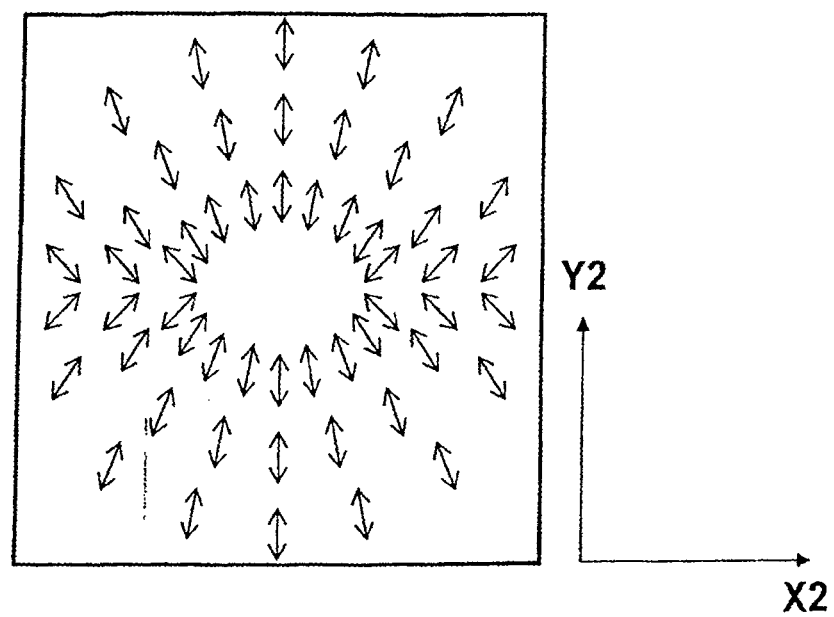
FIG. 19B is a schematic diagram showing the directions of optical axes of a wave plate in the light source unit shown in FIG. 17.
Figure 19C:
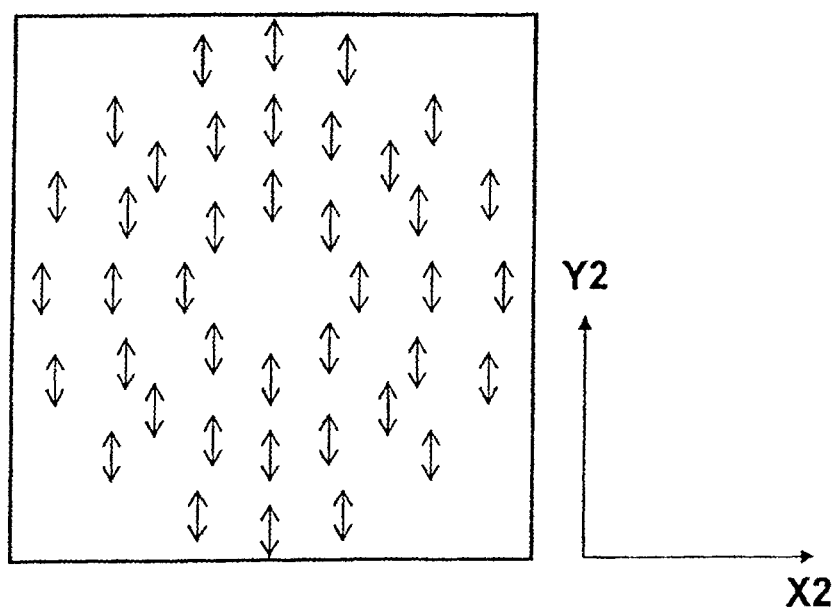
FIG. 19C is a schematic diagram showing the direction of polarization of light transmitted through the wave plate in the light source unit shown in FIG. 17.

FIG. 19A schematically shows the directions of the transmission axes of polarizer 2 with the plurality of concentric recessed and protruding patterns shown in FIG. 9. FIG. 19B schematically shows the directions of the optical axes of wave plate 4. FIG. 19C schematically shows the direction of polarization of light transmitted through wave plate 4 (outgoing light).

As shown in FIG. 19A, if the transmission axes of polarizer 2 are radially formed, the optical axes of wave plate 4 are also radially formed, and the optical axes correspond to the respective transmission axes of polarizer 2 as shown in FIG. 19B.

The directions of the optical axes of wave plate 4 are set relative to the transmission axes of polarizer 2 so as to allow all outgoing light rays to be polarized in a certain direction as shown in FIG. 19C. Specifically, the direction of each optical axis of wave plate 4 is set so as to satisfy the following expression: $\theta_H = (\theta_p + \theta_0)/2$. Here, $\theta_H$ denotes the direction of the optical axis of wave plate 4, $\theta_p$ denotes the direction of the transmission axis of polarizer 3, and $\theta_0$ denotes the direction of polarization of outgoing light.

Figure 20A:
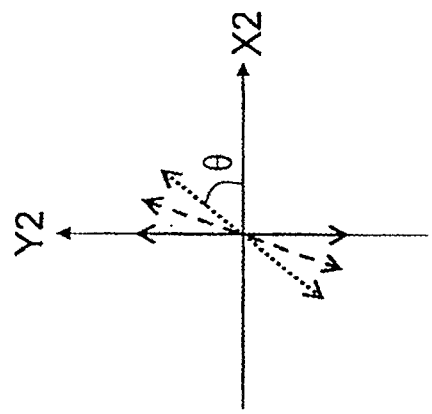
FIG. 20A is a diagram illustrating the relation between the optical axis of the wave plate, the transmission axis of the polarizer, and the direction of polarization of outgoing light, in the light source unit shown in FIG. 17.

Specifically, as shown in FIG. 20A, if the direction of the transmission axis of polarizer 2, the direction of the optical axis of wave plate 4, and the direction of polarization of outgoing light as seen in a direction perpendicular to the incident surface of polarizer 2 are each projected on an X2Y2 plane which is orthogonal to outgoing light, □H denotes the angle between the optical axis of wave plate 4 and an X2 axis, □P denotes the angle between the transmission axis of polarizer 2 and the X2 axis, and □0 denotes the angle between the direction of polarization of outgoing light and the X2 axis.

For polarizer 2 with the transmission axes shown in FIG. 19A, the TM polarized light transmitted through polarizer 2 becomes radial polarized light. When the radial polarized light is transmitted through wave plate 4 with the optical axes shown in FIG. 19B, the direction of polarization rotates in association with the optical axis present in the area where the radial polarized light has been transmitted. As a result, outgoing light is polarized in a certain direction as shown in FIG. 19C.

The transmission axes of polarizer 2 may be arranged in any manner other than the radial manner. For example, if the recessed and protruding patterns of polarizer 2 are radial as shown in FIG. 10, the transmission axes of polarizer 2 are concentrically formed. Also in this case, the optical axes of wave plate 4 are set so as to satisfy the above-described expression.

Figure 20B:
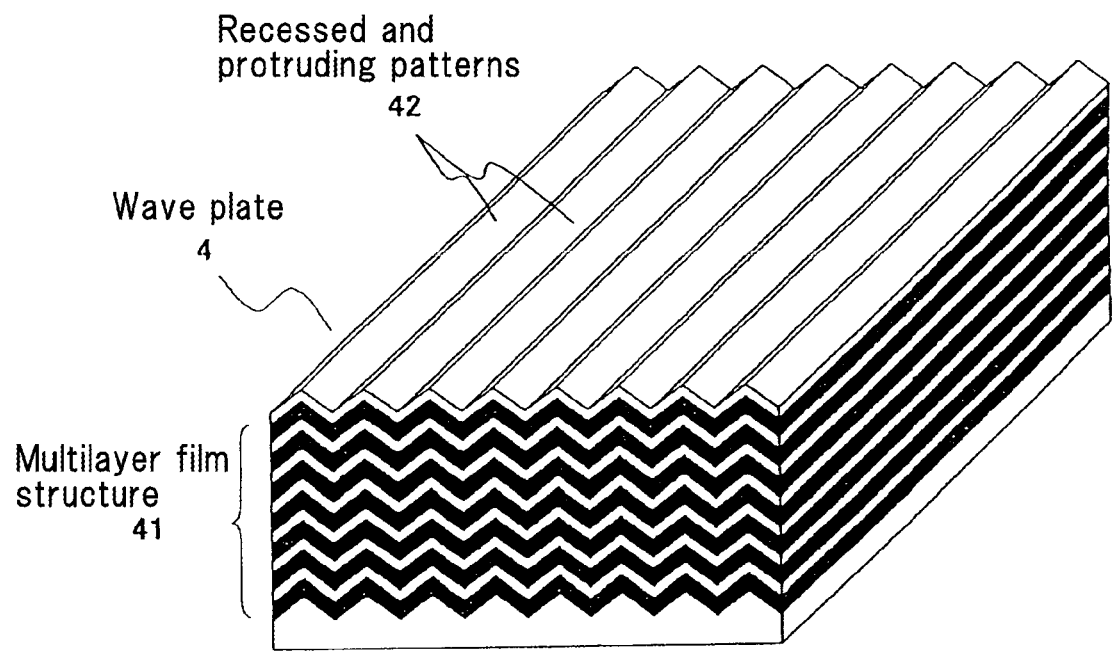
FIG. 20B is a perspective view of the wave plate in the light source unit shown in FIG. 17.

FIG. 20B shows a configuration of wave plate 4. Wave plate 4 includes multilayer film structure 41 and recessed and protruding patterns 42 which have a periodically varying refractive index.

The optical axes of wave plate 4 can be controlled by varying the direction of periodicity of the recessed and protruding patterns. Thus, like the transmission axes of polarizer 2, the optical axes can be formed in the desired directions using the recessed and protruding patterns.

Figure 21A:
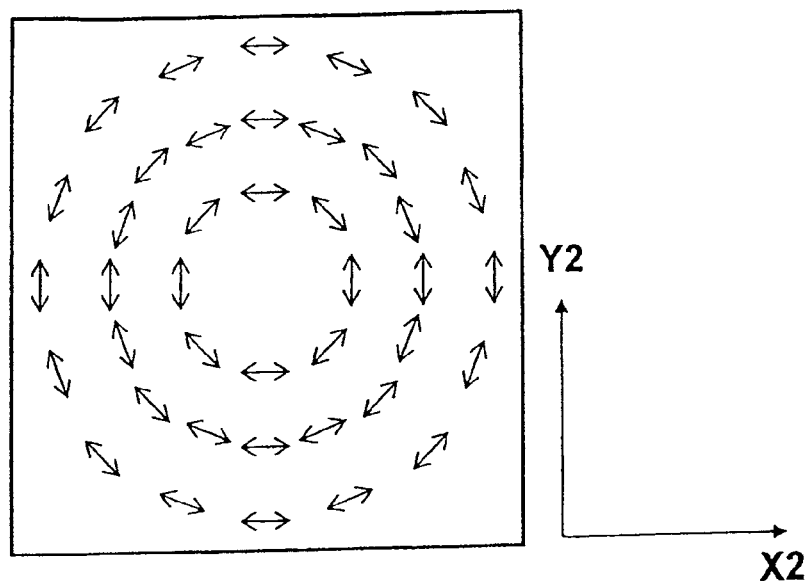
FIG. 21A is a schematic diagram showing the directions of the transmission axes of the polarizer in the light source unit shown in FIG. 17.
Figure 21B:
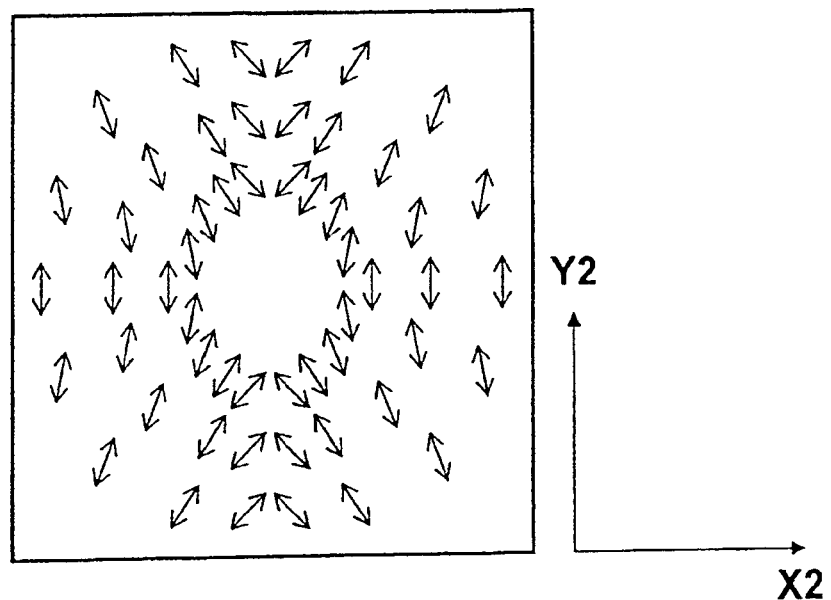
FIG. 21B is a schematic diagram showing the directions of the optical axes of wave plate in the light source unit shown in FIG. 17.
Figure 21C:
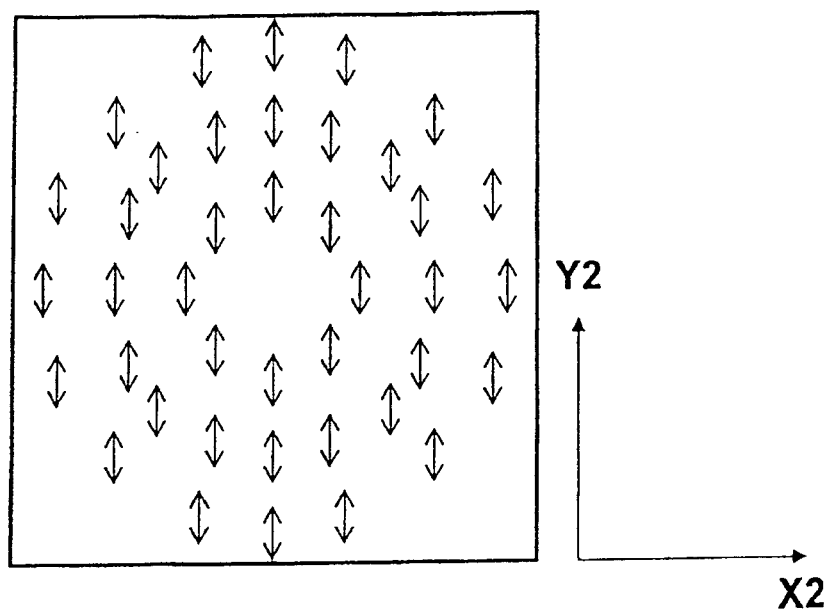
FIG. 21C is a schematic diagram showing the direction of polarization of light emitted by the light source unit shown in FIG. 17.

FIG. 21A schematically shows the directions of the transmission axes of polarizer 2 with the radial patterns shown in FIG. 10. FIG. 21B schematically shows the directions of the optical axes of wave plate 4. FIG. 21C schematically shows the direction of polarization of light transmitted through wave plate 4 (outgoing light).

If the transmission axes of polarizer 2 are concentrically formed as shown in FIG. 21A, the optical axes of wave plate 4 are radially formed as shown in FIG. 21B. The different optical axes correspond to the respective transmission axes of polarizer 2. The directions of the optical axes of wave plate 4 are set so as to polarize all outgoing light rays in a certain direction as shown in FIG. 21C.

For polarizer 2 with the transmission axes shown in FIG. 21A, the TM polarized light transmitted through polarizer 2 becomes tangential polarized light. When the tangential polarized light is transmitted through wave plate 4 with the optical axes shown in FIG. 21B, the direction of polarization rotates in association with the optical axis present in the area where the tangential polarized light has been transmitted. As a result, outgoing light is polarized in a certain direction as shown in FIG. 21C.

In addition to the advantageous effects described in the first exemplary embodiment, the light source unit according to the second exemplary embodiment exerts the following advantageous effects.

According to the first exemplary embodiment, the light source unit emits, for example, TM polarized light as outgoing light. The TM polarized light is radial polarized light or tangential polarized light and cannot be used to illuminate a liquid crystal panel or the like without any change. In the light source unit according to the second exemplary embodiment, the TM polarized light (radial polarized light or tangential polarized light) transmitted through polarizer 2 has, upon passing through wave plate 4, its direction of polarization rotated. Thus, all the outgoing light rays from the light source unit can be polarized in a certain direction. Consequently, the light source unit according to the second exemplary embodiment can be used to illuminate a liquid crystal panel or the like.

(Third Exemplary Embodiment)

In the above-described light source units according to the first and second exemplary embodiments, the recessed and protruding structures of polarizer 2 and diffraction grating 3 are formed from a metal material such as aluminum. However, the recessed and protruding structures may be formed by a technique using a photonic crystal.

Figure 22:
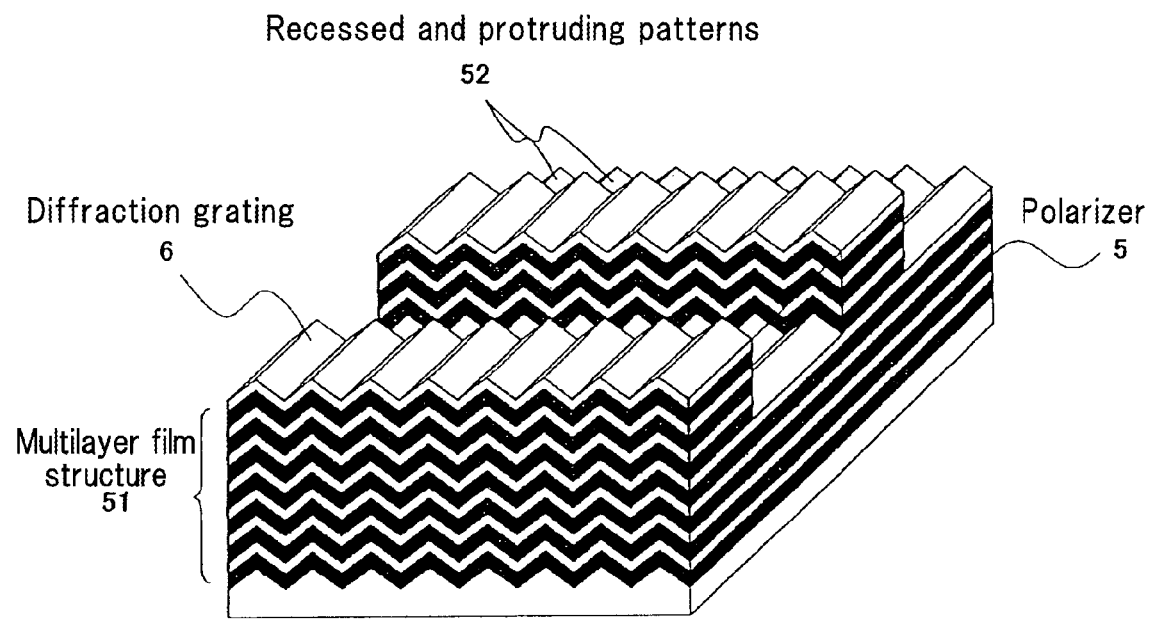
FIG. 22 is a perspective view showing a configuration of a polarizer and a diffraction grating which are used in a light source unit according to a third exemplary embodiment.

FIG. 22 shows configurations of a polarizer and a diffraction grating which are used in a light source unit according to a third exemplary embodiment.

As shown in FIG. 22, polarizer 5 includes multilayer film structure 51 and recessed and protruding patterns 52 which have a periodically varying refractive index. Diffraction grating 6 formed from a photonic crystal is formed on recessed and protruding patterns 52. Diffraction grating 6 is formed from radial recessed and protruding patterns.

In the light source unit according to the third exemplary embodiment, polarizer 5 with diffraction grating 6 shown in FIG. 22 is positioned opposite the emission surface of an LED. Specifically, the light source unit according to the third exemplary embodiment corresponds to the light source unit according to the first or second exemplary embodiment in which polarizer 2 and diffraction grating 3 are replaced with polarizer 5 and diffraction grating 6, respectively. Pitch P1 and depth H1 of the recessed and protruding patterns of the polarizer and pitch P2 and depth H2 of the recessed and protruding patterns of the diffraction grating are basically the same as pitch P1 and depth H1 and pitch P2 and depth H2 in the configurations described in the first and second exemplary embodiments.

Also in the light source unit according to the third exemplary embodiment, the recessed and protruding structure formed from a photonic crystal is thinner than a quarter wave plate formed from a crystal such as quartz or mica and is free from the heat resistance problem unlike the case of a quarter wave plate formed from a film. Thus, the third exemplary embodiment exerts advantageous effects similar to those of the first exemplary embodiment and the second exemplary embodiment.

In the light source unit according to the third exemplary embodiment, the recessed and protruding patterns of polarizer 5 and the recessed and protruding patterns of diffraction grating 6 may be the same as the recessed and protruding patterns described in the first and second exemplary embodiments.

Now, a method for producing polarizer 5 and diffraction grating 6 in the light source unit according to the third exemplary embodiment will be described.

FIG. 23A to FIG. 23E show a procedure of a process of producing polarizer 5 with diffraction grating 6.

Figure 23A:
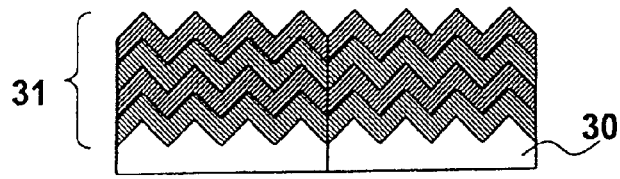
FIG. 23A is a process diagram showing a procedure of a technique for producing the polarizer and the diffraction grating shown in FIG. 22.

First, as shown in FIG. 23A, desired recessed and protruding patterns are formed on the surface of substrate 10 formed from quartz or the like. On the surface on which the recessed and protruding patterns are formed, a transparent first layer with a high refractive index and a transparent second layer with a low refractive index are alternately deposited to form periodic structure 31.

Figure 23B:
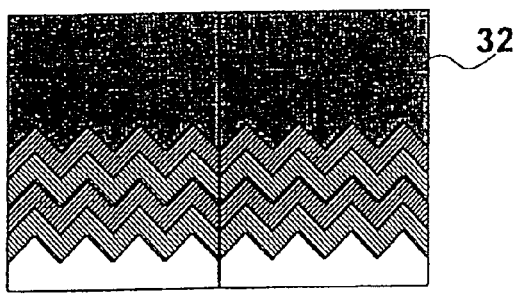
FIG. 23B is a process diagram showing the procedure of the technique for producing the polarizer and the diffraction grating shown in FIG. 22.
Figure 23C:
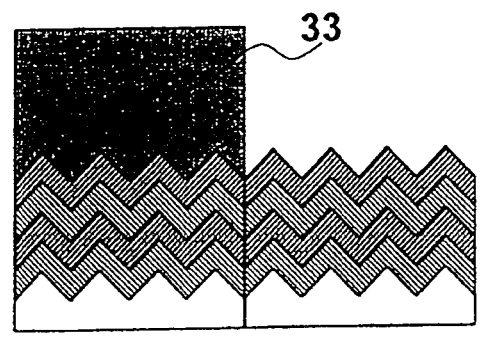
FIG. 23C is a process diagram showing the procedure of the technique for producing the polarizer and the diffraction grating shown in FIG. 22.

Then, as shown in FIG. 23B, a resist is applied onto periodic structure 31 to form resist layer 32. Then, as shown in FIG. 23C, resist pattern 33 is formed utilizing photolithography. Resist pattern 33 is configured to form recessed and protruding patterns of diffraction grating 6.

Figure 23D:
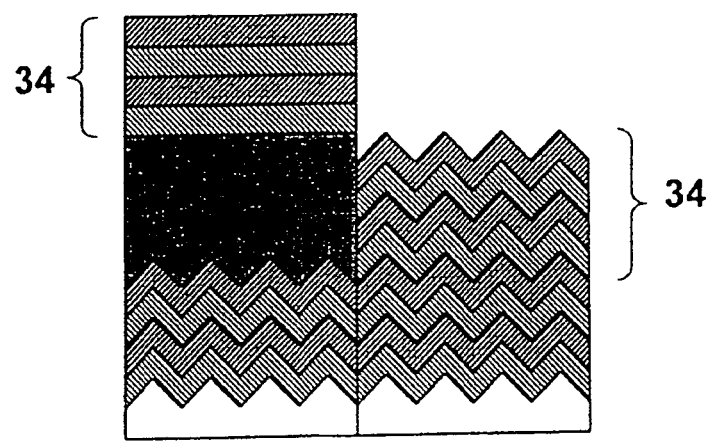
FIG. 23D is a process diagram showing the procedure of the technique for producing the polarizer and the diffraction grating shown in FIG. 22.

Then, as shown in FIG. 23D, on the surface on which resist pattern 33 is formed, a transparent first layer with a high refractive index and a transparent second layer with a low refractive index are alternately deposited to form periodic structure 34.

Figure 23E:
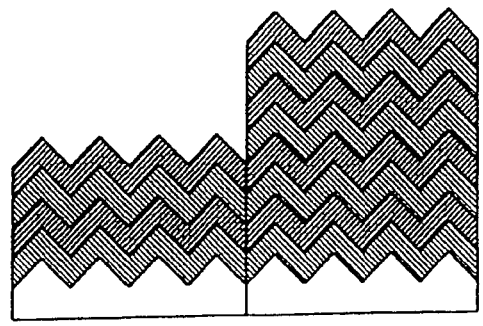
FIG. 23E is a process diagram showing the procedure of the technique for producing the polarizer and the diffraction grating shown in FIG. 22.

Finally, as shown in FIG. 23E, resist pattern 33 and periodic structure 34 on resist pattern 33 are lifted off to obtain polarizer 5 and diffraction grating 6 shown in FIG. 22.

For example, in periodic structures 31 and 34, a first layer may be formed from niobium pentoxide ($Nb_2O_5$), and a second layer may be formed from silicon dioxide ($SiO_2$).

The light source unit according to each of the above-described exemplary embodiments is illustrative. Changes understandable for those skilled in the art may be made to the configuration of the light source unit according to each of the above-described exemplary embodiments without departing from the spirit of the invention.

Figure 24:
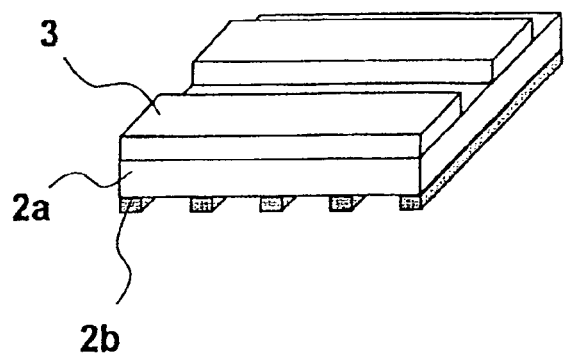
FIG. 24 is a perspective view of another configuration of the polarizer and the diffraction grating in the light source unit according to the present invention.

For example, polarizer 2 described in the first and second exemplary embodiments may be structured such that recessed and protruding patterns 2b are formed on one surface of substrate 2a, with recessed and protruding patterns of diffraction grating 3 formed on the other surface of substrate 2a, as shown in FIG. 24. In this case, polarizer 2 is arranged such that the surface with diffraction grating 3 formed thereon lies opposite emission surface 1a of LED 1.

Figure 25:
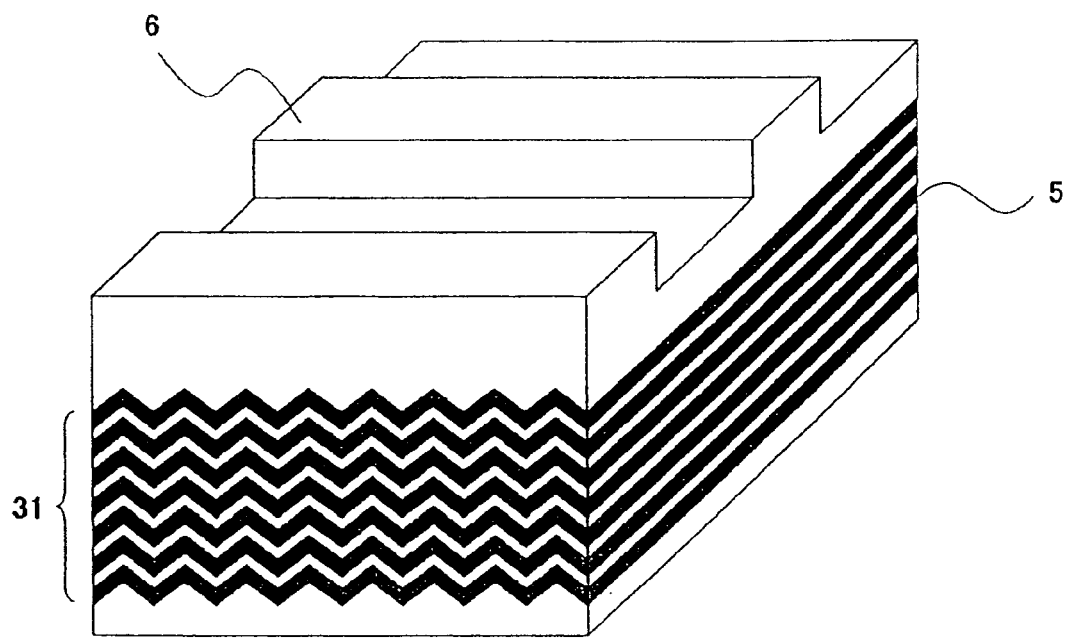
FIG. 25 is a perspective view of yet another configuration of the polarizer and the diffraction grating in the light source unit according to the present invention.

Furthermore, polarizer 5 described in the third exemplary embodiment may be structured such that diffraction grating 6 formed from such recessed and protruding patterns as described in the first and second exemplary embodiments is formed on periodic structure 31 in which the transparent first layer with a high refractive index and the transparent second layer with a low refractive index are alternately deposited, as shown in FIG. 25. The recessed and protruding patterns of diffraction grating 6 can be formed by the technique for producing the recessed and protruding patterns of diffraction grating 3 as described in the first and second exemplary embodiments.

Moreover, in the configuration shown in FIG. 25, periodic structure 31 may be formed on one surface of a transparent substrate. The recessed and protruding patterns of diffraction grating 6 may be formed on the other surface of the transparent substrate.

Moreover, diffraction grating 6 may be formed from a photonic crystal, and polarizer 5 may be formed from the recessed and protruding patterns described in the first and second exemplary embodiments. In this case, for example, the technique described in the first and second exemplary embodiments is used to form the recessed and protruding patterns of polarizer 5. A transparent layer is formed on the recessed and protruding patterns. Then, the recessed and protruding patterns of diffraction grating 6 formed from a photonic crystal are formed on the transparent layer.

Furthermore, in the first to third exemplary embodiments, the polarizer may include recessed and protruding patterns in which the direction of the transmission axis varies depending on the position in the plane of the polarizer. Any of various types of such recessed and protruding patterns is applicable.

Figure 26A:
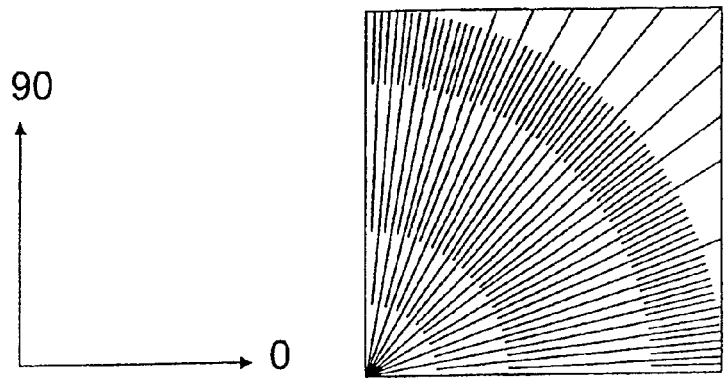
FIG. 26A is a schematic diagram showing an example of the recessed and protruding patterns of the polarizer which is used in the light source unit according to the present invention.
Figure 26B:
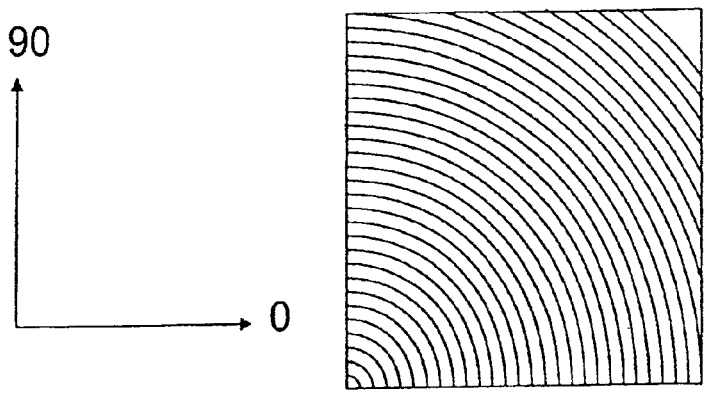
FIG. 26B is a schematic diagram showing another example of the recessed and protruding patterns of the polarizer which is used in the light source unit according to the present invention.
Figure 26C:
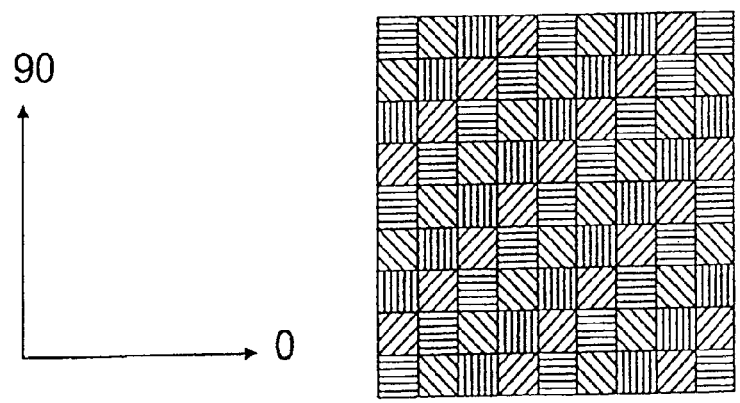
FIG. 26C is a schematic diagram showing yet another example of the recessed and protruding patterns of the polarizer which is used in the light source unit according to the present invention.

FIG. 26A to FIG. 26C show an example of recessed and protruding patterns of the polarizer.

In the example shown in FIG. 26A, the polarizer includes a plurality of recessed and protruding patterns formed radially around a corner of the polarizer shown in the lower left of FIG. 26A. In this polarizer, when the horizontal direction is assumed to be 0° and the vertical direction is assumed to be 90°, the direction of the transmission axis varies consecutively between 0° and 90°.

In the example shown in FIG. 26B, the polarizer includes a plurality of recessed and protruding patterns formed concentrically around a corner of the polarizer shown in the lower left of FIG. 26B. Also in this polarizer, the direction of the transmission axis varies consecutively between 0° and 90° as is the case with the recessed and protruding patterns shown in FIG. 26A.

In the example shown in FIG. 26C, the polarizer includes first areas in which recessed and protruding patterns are formed in the horizontal direction at equal intervals, second areas in which recessed and protruding patterns are formed at equal intervals and at an angle of 45° to the horizontal direction, and third areas in which recessed and protruding patterns are formed in the vertical direction at equal intervals. The first to third areas are formed in a predetermined order into a matrix. In this polarizer, the direction of the transmission axis varies depending on the position in the plane of the polarizer.

According to the light source unit of the present invention described above, light reflected and diffracted by the recessed and protruding structure is diffused. Since the transmission axis of the polarizer varies depending on the position in the plane of the polarizer, the diffused light has a plurality of different directions of polarization corresponding to the directions of the respective transmission axes. Therefore, while the diffused light reflected and diffracted by the recessed and protruding structure propagates between the emission surface of the light emitting element and the polarizer, while being repeatedly reflected and diffracted, a portion of the diffused light passes through the polarizer. The light source unit of the present invention can thus increase the intensity of outgoing light from the light source unit compared to a configuration in which the polarizer simply arranged above the emission surface of the LED.

Furthermore, the recessed and protruding structure of the polarizer is sufficiently thinner than a quarter wave plate formed from a crystal such as quartz or mica. Thus, compared to a light source unit with a quarter wave plate (see FIG. 3), the light source unit of the present invention can have a reduced distance between the emission surface of the light emitting element and the polarizer. This enables a reduction in the amount of light leaking through the side surface of the light source unit, thus allowing the intensity of outgoing light to be increased.

Additionally, the recessed and protruding structure can be formed from a photonic crystal or recessed and protruding patterns made of a metal. The high heat resistance of the metal and the photonic crystal makes the recessed and protruding structure free from such a heat resistance problem that is associated with a quarter wave plate formed from a film. Therefore, the performance of the recessed and protruding structure regarding reflection and diffraction is prevented from being disadvantageously degraded by heat from the light emitting element.

Besides liquid crystal projectors, the light source unit of the present invention is applicable to devices in general which use polarized light.

An essential part of a projector to which the present invention is applied includes any one of the light source units described above in the first to third exemplary embodiments, a display element which spatially modulates light from the light source unit, and a projection optical system which projects image light formed by the display element. If the light source unit includes a wave plate, the display element may be a liquid crystal panel. Furthermore, if the light source unit includes no wave plate, the display element may be a liquid crystal panel with a wave plate provided at an incident surface.

The present invention has been described above with reference to the exemplary embodiments. However, the present invention is not limited to the above-described exemplary embodiments. Various changes understandable to those skilled in the art may be made to the configurations and operations of the present invention without departing from the spirit of the present invention.

The present application claims the priority based on Japanese Patent Application No. 2010-257997 filed on Nov. 18, 2010 and incorporates herein the entirety of the disclosure thereof.

What is claimed is:

1. A light source unit comprising:
a light emitting element with an emission surface; and
a polarizer that is provided opposite the emission surface of said light emitting element and in which a direction of a transmission axis varies depending on a position in a plane of said polarizer,
wherein said polarizer includes a recessed and protruding structure which transmits, from among light that exits from the emission surface and that travels from said light emitting element into said polarizer, a portion of the light whose polarization direction is parallel to the transmission axis, while reflecting and diffracting a portion of the light whose polarization direction is orthogonal to the transmission axis.

2. The light source unit according to claim 1, wherein the recessed and protruding structure comprises:
a first layer that includes a plurality of first periodic recessed and protruding patterns and in which the transmission axis is formed in a direction of periodicity of the first recessed and protruding patterns; and
a second layer that includes a plurality of second periodic recessed and protruding patterns which reflect and diffract at least a portion of incident light whose polarization direction is orthogonal to the transmission axis,
wherein a surface of said polarizer on which the second layer is formed is provided opposite the emission surface of said light emitting element.

3. The light source unit according to claim 2, wherein the second layer is formed on the first layer.

4. The light source unit according to claim 2, wherein the first layer is formed on one surface of a substrate, and the second layer is formed on another surface of the substrate.

5. The light source unit according to claim 2, wherein the transmission axes of the plurality of first recessed and protruding patterns are provided radially around an optical axis of said polarizer, and
the plurality of second recessed and protruding patterns are periodically formed in a tangential direction of a concentric circle centered around the optical axis.

6. The light source unit according to claim 2, wherein the transmission axes of the plurality of first recessed and protruding patterns are provided concentrically around an optical axis of said polarizer, and
the plurality of second recessed and protruding patterns are periodically formed in a radial direction around the optical axis.

7. The light source unit according to claim 2, wherein said polarizer comprises a plurality of areas among which a direction of the transmission axis varies, and the first and second layers are formed in each of the areas.

8. The light source unit according to claim 2, wherein the plurality of first recessed and protruding patterns are formed from a metal.

9. The light source unit according to claim 2, wherein the first layer comprises a periodic structure in which at least two layers with different refractive indices are alternately deposited.

10. The light source unit according to claim 1, further comprising a wave plate that is positioned opposite a surface of said polarizer which is opposite to said light emitting element side of said polarizer, said wave plate comprising optical axes with a direction varying depending on a position in a plane of said wave plate,
wherein the optical axes of said wave plate correspond to the transmission axes of said polarizer and are formed so that outgoing light emitted by said polarizer via said wave plate is polarized in a certain direction.

11. The light source unit according to claim 10, wherein if the direction of the transmission axis of said polarizer, the direction of the optical axis of said wave plate, and the direction of polarization of the outgoing light as seen in a direction perpendicular to a surface of said light emitting element side of said polarizer are each projected on a plane which is orthogonal to the outgoing light, when $\theta_H$, $\theta_P$, and $\theta_O$ denote an angle between the optical axis of said wave plate and a specific direction in an in-plane direction of the plane, an angle between the transmission axis of said polarizer and the specific direction, and an angle between the direction of polarization of the outgoing light and the specific direction, respectively, the $\theta_H$ satisfies $\theta_H = (\theta_p + \theta_0)/2$.

12. A projection display device comprising:
 the light source unit according to claim 1;
 a display element that spatially modulates light from said light source unit; and
 a projection optical system that projects image light formed by said display element.

* * * * *